US012593683B2

(12) United States Patent
Srivastava et al.

(10) Patent No.:  US 12,593,683 B2
(45) Date of Patent:  Mar. 31, 2026

(54) STRUCTURE WITH INDUCTOR EMBEDDED IN BONDED SEMICONDUCTOR SUBSTRATES AND METHODS

(71) Applicant: GlobalFoundries U.S. Inc., Malta, NY (US)

(72) Inventors: Ravi P. Srivastava, Clifton Park, NY (US); Jagar Singh, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 617 days.

(21) Appl. No.: 18/051,037

(22) Filed: Oct. 31, 2022

(65) Prior Publication Data

US 2024/0145382 A1      May 2, 2024

(51) Int. Cl.
*H10D 1/20*          (2025.01)
*H01L 21/768*        (2006.01)
          (Continued)

(52) U.S. Cl.
CPC .... *H01L 23/5227* (2013.01); *H01L 21/76898* (2013.01); *H01L 23/481* (2013.01);
          (Continued)

(58) Field of Classification Search
CPC ... H01L 23/5227; H01L 23/481; H01L 24/08; H01L 24/80; H01L 2224/08146;
          (Continued)

(56) References Cited

U.S. PATENT DOCUMENTS 8,143,952 B2 *    3/2012    Kim ................... H01L 23/5227
                                                                336/200
8,658,535 B2      2/2014    Andry et al.
                  (Continued)

OTHER PUBLICATIONS

Yook et al., "High Power and High Q Spiral Inductors using TSV Processes," Extended Abstract of the 2013 International Conference on Solid State Devices and Materials, 2013, pp. 126-127.
                  (Continued)

*Primary Examiner* — Omar F Mojaddedi
(74) *Attorney, Agent, or Firm* — Francois Pagette; Hoffman Warnick LLC

(57)          ABSTRACT

Disclosed is a structure and a method of forming the structure. The structure includes first and second semiconductor substrates with adjacent surfaces (e.g., bonded surfaces), a first spiral-shape metallic feature in the first semiconductor substrate, and a second spiral-shaped metallic feature in the second semiconductor substrate. The second spiral-shaped metallic feature is aligned above and electrically connected to the first spiral-shaped metallic feature. In some embodiments, the second spiral-shaped metallic feature is stacked on and immediately adjacent to the first spiral-shaped metallic feature at the bonded surfaces, thereby forming a relatively large inductor with high $Q_{dc}$ in a relatively small area. In other embodiments, the first and second spiral-shaped metallic features are discrete inductors located on opposite sides of the semiconductor substrates from the bonded surfaces but electrically connected in parallel (e.g., using stacked TSVs), effectively forming a relatively large inductor with a high $Q_{dc}$ in a relatively small area.

20 Claims, 17 Drawing Sheets

(51) Int. Cl.
 *H01L 23/00* (2006.01)
 *H01L 23/48* (2006.01)
 *H01L 23/522* (2006.01)

(52) U.S. Cl.
 CPC .............. *H01L 24/08* (2013.01); *H01L 24/80* (2013.01); *H10D 1/20* (2025.01); *H01L 2224/08146* (2013.01); *H01L 2224/80895* (2013.01); *H01L 2224/80896* (2013.01)

(58) Field of Classification Search
 CPC ........... H01L 2224/80895; H01L 2224/80896; H10D 1/20
 See application file for complete search history.

(56) References Cited

U.S. PATENT DOCUMENTS

2011/0073987 A1\* 3/2011 Mackh .................. H01L 23/481
257/E29.166

2013/0222101 A1\* 8/2013 Ito ............................. H01F 3/08
336/83
2019/0057942 A1\* 2/2019 Male ..................... H01L 23/645
2023/0123423 A1\* 4/2023 Gao .................... H01L 23/5227
257/428

OTHER PUBLICATIONS

Vitale et al., "Ultra fine-pitch TSV Technology for ultra-dense high-Q RF inductors," 2015 Symposium on VLSI Technology Digest for Technical Papers, 2 pages.
Vitale et al., High-Q 3D Embedded Inductors using TSV for Rf Mems Tunable Bandpass Filters (4.65-6.8 GHZ), Proceedings of the 7th European Microwave Integrated Circuits Conference, Oct. 29-30, 2012, pp. 822-825.
Hsieh et al., "High-Q 3D-IPD Diplexer with High Aspect Ratio Cu Pillar Inductor," IEEE 2018, 5 pages.

\* cited by examiner

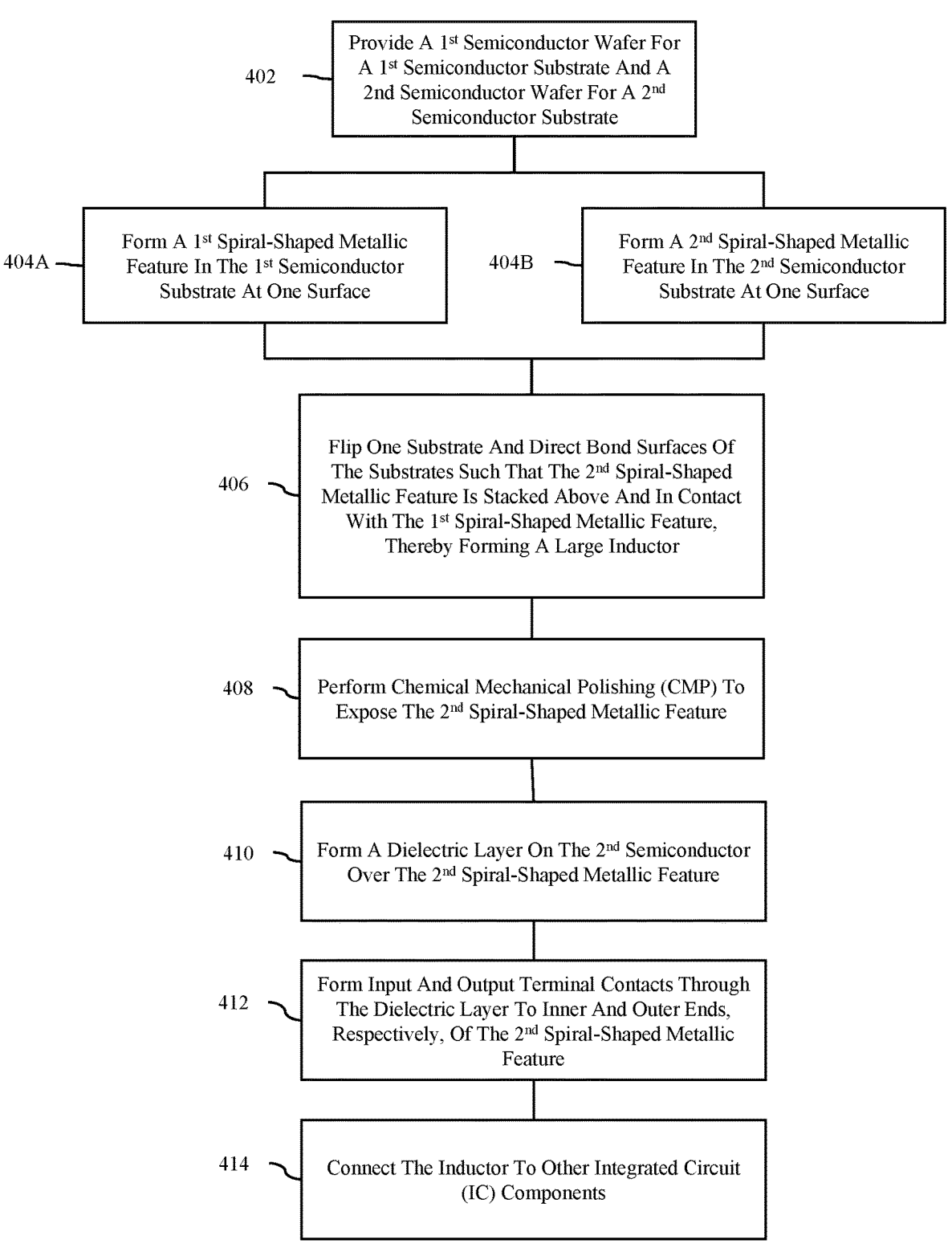

402 — Provide A 1st Semiconductor Wafer For A 1st Semiconductor Substrate And A 2nd Semiconductor Wafer For A 2nd Semiconductor Substrate 404A — Form A 1st Spiral-Shaped Metallic Feature In The 1st Semiconductor Substrate At One Surface 404B — Form A 2nd Spiral-Shaped Metallic Feature In The 2nd Semiconductor Substrate At One Surface 406 — Flip One Substrate And Direct Bond Surfaces Of The Substrates Such That The 2nd Spiral-Shaped Metallic Feature Is Stacked Above And In Contact With The 1st Spiral-Shaped Metallic Feature, Thereby Forming A Large Inductor 408 — Perform Chemical Mechanical Polishing (CMP) To Expose The 2nd Spiral-Shaped Metallic Feature 410 — Form A Dielectric Layer On The 2nd Semiconductor Over The 2nd Spiral-Shaped Metallic Feature 412 — Form Input And Output Terminal Contacts Through The Dielectric Layer To Inner And Outer Ends, Respectively, Of The 2nd Spiral-Shaped Metallic Feature 414 — Connect The Inductor To Other Integrated Circuit (IC) Components

FIG. 4

115
116
117
B 112
110
B 118     tsub1     h1     119

111

115
116
117
B

110
B 118     119

STRUCTURE WITH INDUCTOR EMBEDDED IN BONDED SEMICONDUCTOR SUBSTRATES AND METHODS

BACKGROUND

The present disclosure relates to inductors and, more particularly, to embodiments of a structure including a high quality factor (Q) inductor and to embodiments of a method of forming the structure.

The quality factor (Q) and, more particularly, the direct current (DC) quality factor ($Q_{dc}$) of an inductor can be used to estimate the performance of the inductor. $Q_{dc}$ depends upon the DC ratio of inductance ($L_{dc}$) to resistance ($R_{dc}$) (i.e., $Q_{dc}=\omega\ L_{dc}/R_{dc}$). High power devices and high performance radio frequency (RF) circuits require inductors that have a relatively high $Q_{dc}$ at low frequencies. High $Q_{dc}$ is typically achieved by forming back end of the line (BEOL) spiral-shaped metallic features with relatively wide metallic lines for the coils to reduce $R_{dc}$. However, increasing the width of the metallic lines increases the overall size of the inductor (i.e., increases area consumption).

SUMMARY

Disclosed herein are embodiments of a semiconductor structure including an inductor embedded within a pair of semiconductor substrates.

The disclosed embodiments of the semiconductor structure can include a first semiconductor substrate and a second semiconductor substrate in contact with (e.g., bonded to) the first semiconductor substrate. The semiconductor structure can further include a first spiral-shape metallic feature in the first semiconductor substrate and a second spiral-shaped metallic feature in the second semiconductor substrate. The first spiral-shaped metallic feature and the second spiral-shaped metallic feature can be electrically connected.

More specifically, some disclosed embodiments of the semiconductor structure can include a first semiconductor substrate and a second semiconductor substrate in contact with (e.g., bonded to) the first semiconductor substrate. The semiconductor structure can further include a first spiral-shape metallic feature in the first semiconductor substrate and a second spiral-shaped metallic feature in the second semiconductor substrate. The first spiral-shaped metallic feature and the second spiral-shaped metallic feature can have essentially identical horizontal cross-sections. Furthermore, the second spiral-shaped metallic feature can be stacked above and immediately adjacent to the first spiral-shaped metallic feature at the adjacent surfaces of the first and second semiconductor substrates so that they are electrically connected and, furthermore, so that in combination they form a single relatively large inductor.

Other disclosed embodiments of the semiconductor structure can similarly include a first semiconductor substrate and a second semiconductor substrate in contact with (e.g., bonded to) the first semiconductor substrate such that the first semiconductor substrate and the second semiconductor substrate have bonded surfaces. The semiconductor structure can further include a first spiral-shape metallic feature and, particularly, a first inductor in the first semiconductor substrate and a second spiral-shaped metallic feature and, particularly, a second inductor in the second semiconductor substrate. The second inductor can be aligned above the first inductor, but the two inductors can be physically separated from each other. In these embodiments, the first inductor and the second inductor can be electrically connected in parallel so that, in combination, the effectively form a single relatively large inductor (i.e., they, given the parallel connection, they effectively function as a single relatively large inductor). This parallel connection can be established, for example, through a combination of interconnects including, but not limited to, through-substrate vias (TSVs).

Also disclosed herein are method embodiments for forming the disclosed semiconductor structures. The method can include forming a first spiral-shape metallic feature in a first semiconductor substrate and forming a second spiral-shaped metallic feature in a second semiconductor substrate. The method can further include forming a structure that includes the first semiconductor substrate and the second semiconductor substrate, where the second semiconductor substrate is in contact with (e.g., bonded to) the first semiconductor substrate and where the second spiral-shaped metallic feature is electrically connected to the first spiral-shaped metallic feature.

BRIEF DESCRIPTION OF THE DRAWINGS

The disclosed embodiments will be better understood from the following detailed description with reference to the drawings, which are not necessarily drawn to scale and in which:

FIGS. 2A-2C are cross-section diagrams illustrating another disclosed semiconductor structure embodiment;

FIG. 4 is a flow diagram illustrating a method embodiment for forming the semiconductor structure embodiment of FIGS. 1A-1C;

DETAILED DESCRIPTION

As mentioned above, high power devices and high performance RF circuits require inductors that have a relatively high $Q_{dc}$ at low frequencies. High $Q_{dc}$ is typically achieved by forming BEOL spiral-shaped metallic features with relatively wide metallic lines for the coils to reduce $R_{dc}$. However, increasing the width of the metallic lines increases the overall size of the inductor (i.e., increases area consumption).

In view of the foregoing, disclosed herein are embodiments of a semiconductor structure including an inductor embedded within a pair of semiconductor substrates (which are, for example, bonded together) and a method of forming the structure that facilitates increasing $Q_{dc}$ while minimizing any corresponding increase in area consumption. Specifically, in each of the disclosed embodiments, the structure can include a first semiconductor substrate and a second semiconductor substrate in contact with (e.g., bonded to) the first semiconductor substrate (i.e., the two semiconductor substrates have bonded surfaces). The structure can further include a first spiral-shape metallic feature in the first semiconductor substrate and a second spiral-shaped metallic feature in the second semiconductor substrate. The second spiral-shaped metallic feature can be aligned above and electrically connected to the first spiral-shaped metallic feature. In some embodiments, the second spiral-shaped metallic feature is stacked on and immediately adjacent to the first spiral-shaped metallic feature at the adjacent surfaces of the substrates, thereby forming a single relatively large inductor with high $Q_{dc}$ in a relatively small area. In other embodiments, the first and second spiral-shaped metallic features are discrete inductors located on opposite sides of the semiconductor substrates from the adjacent surfaces (i.e., physically separated) but electrically connected in parallel (e.g., using stacked TSVs within the semiconductor substrates along with other interconnect structures), effectively forming a relatively large inductor with a high $Q_{dc}$ in a relatively small area.

Figure 1A:
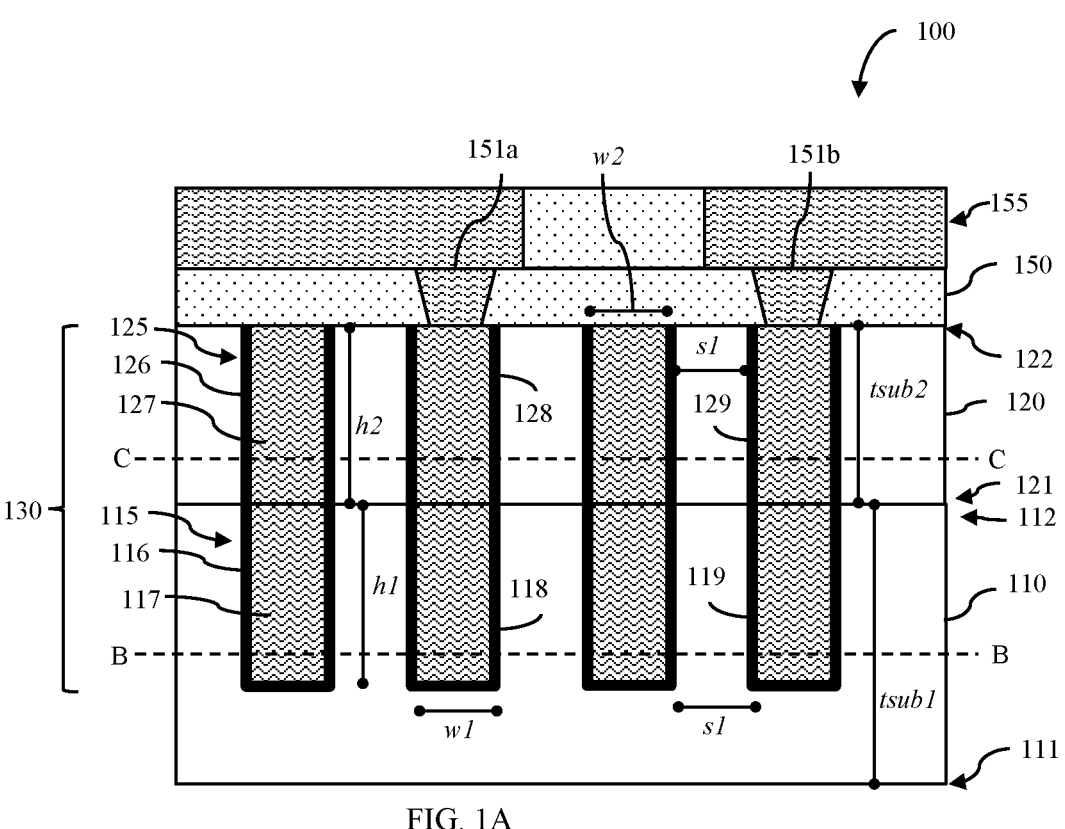
FIGS. 1A-1C are cross-section diagrams illustrating a disclosed semiconductor structure embodiment.
Figure 1B:
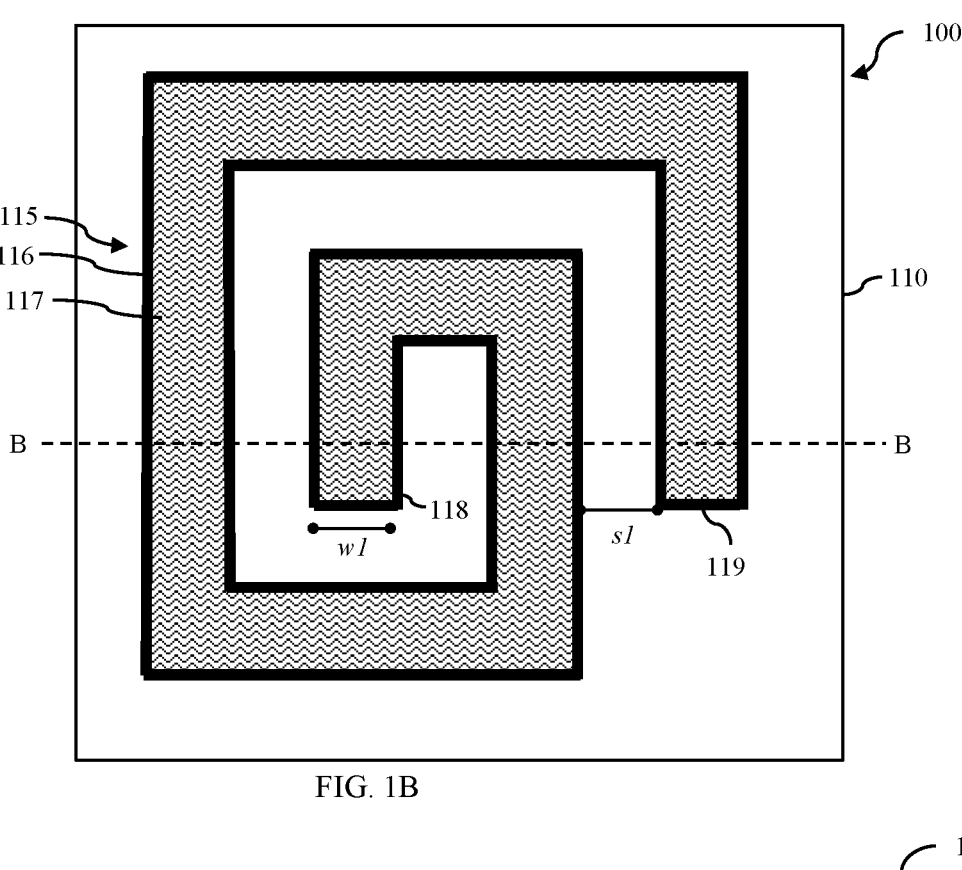
Figure 1C:
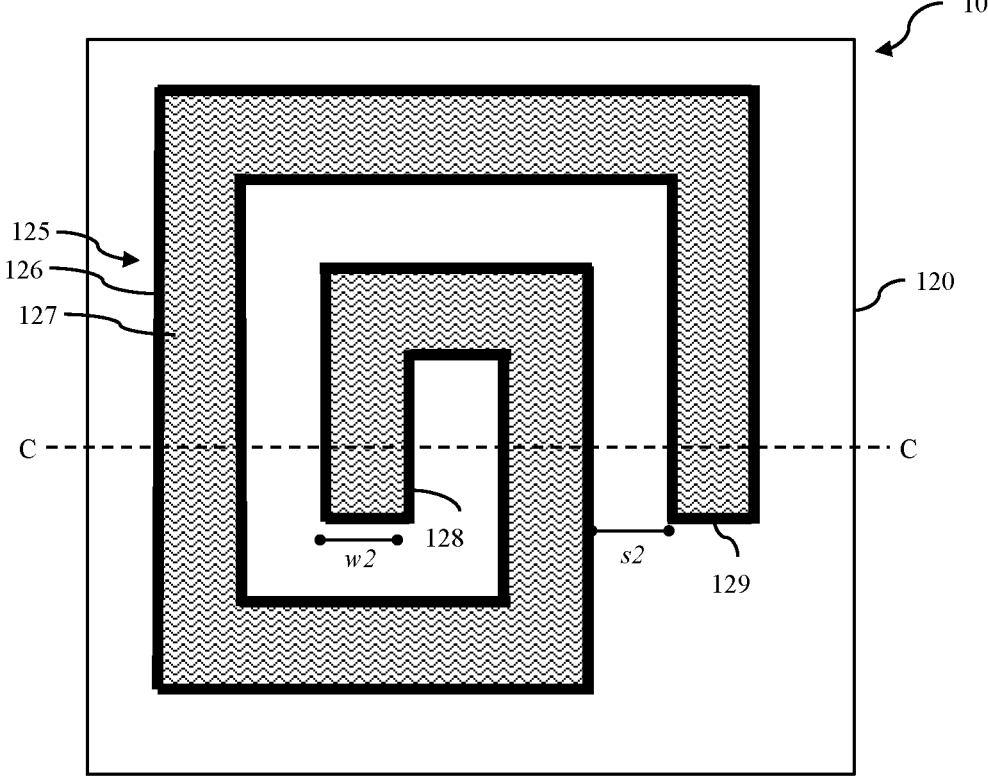
Figure 2A:
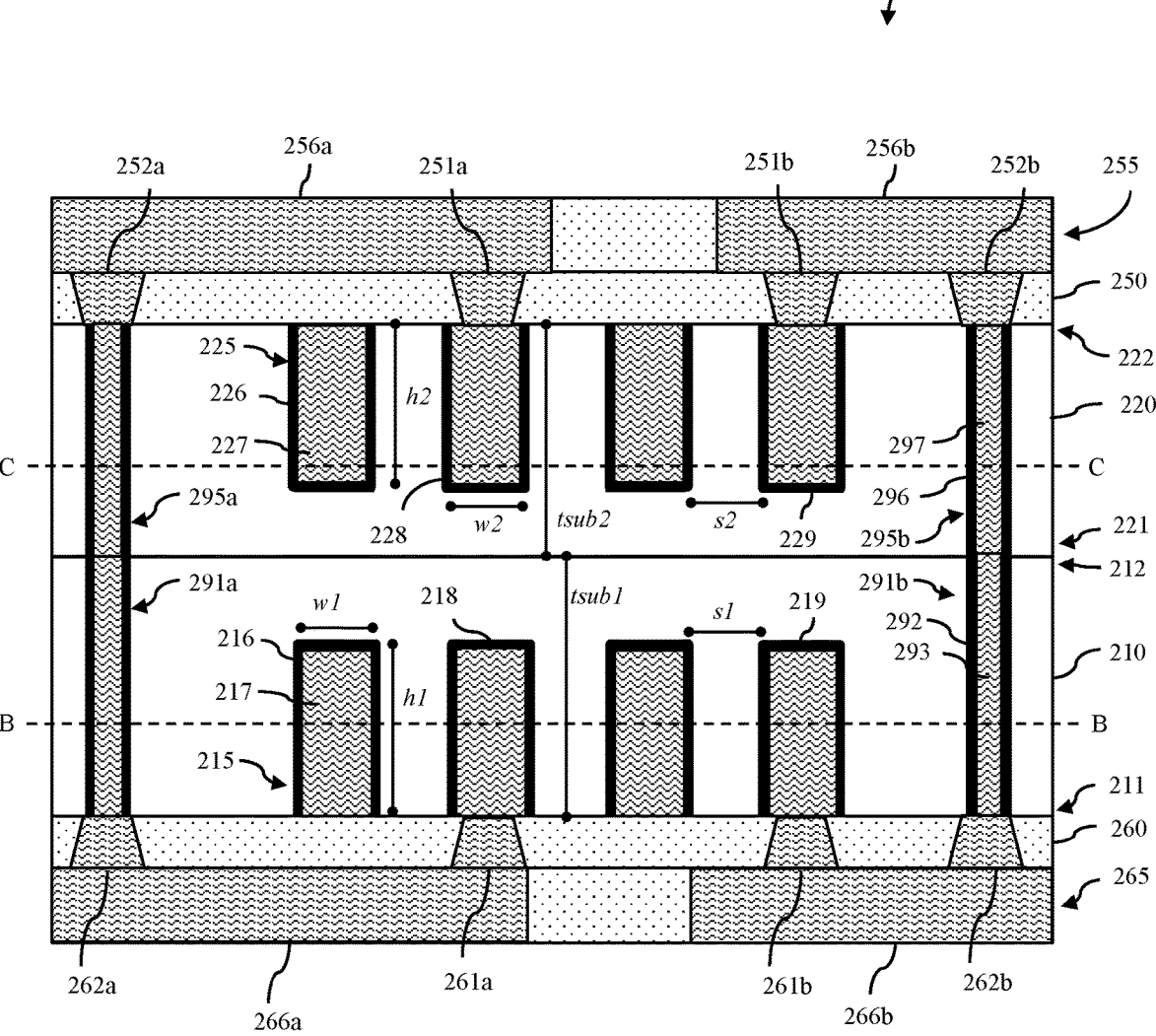
Figures 2B, 2C:
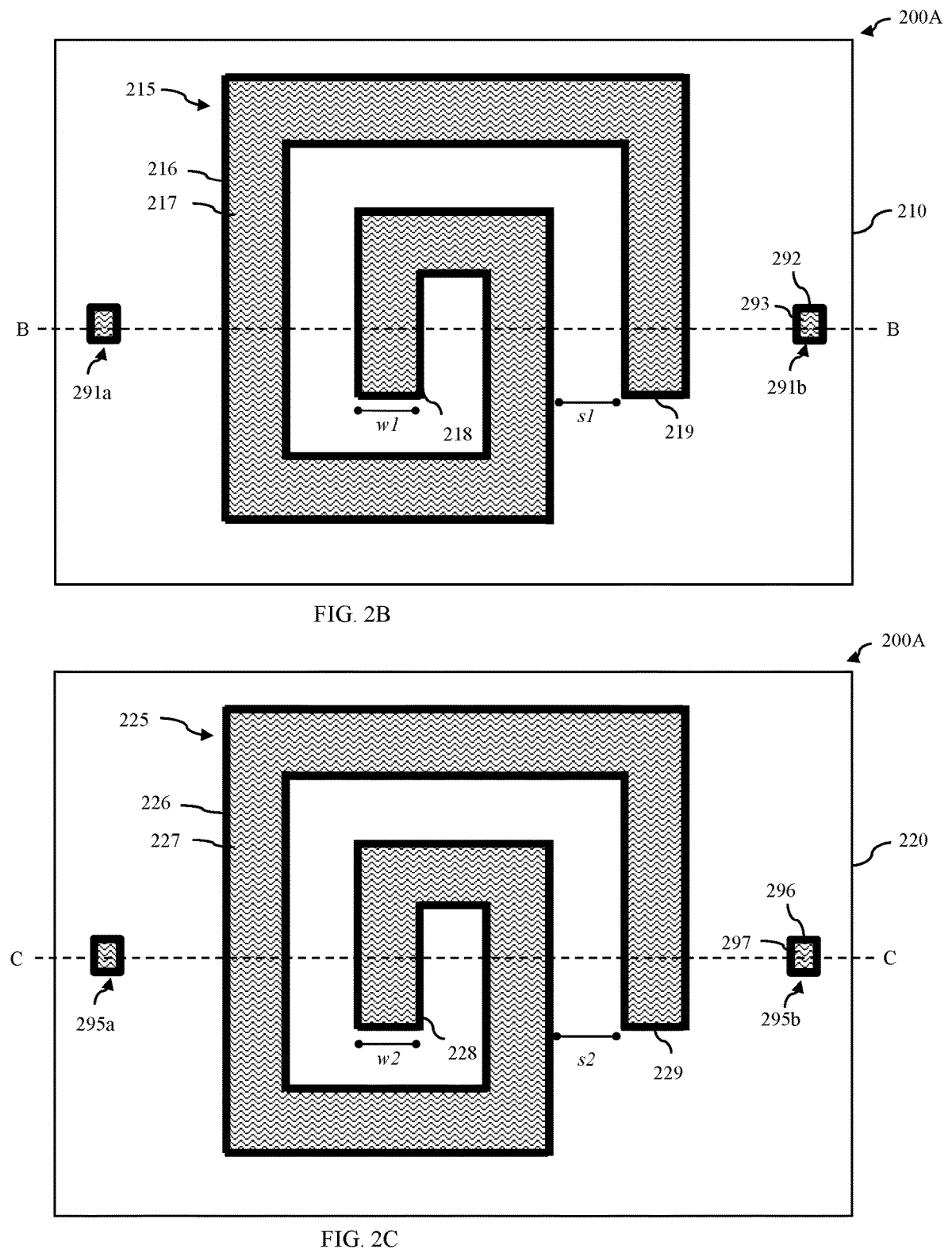
Figure 3A:
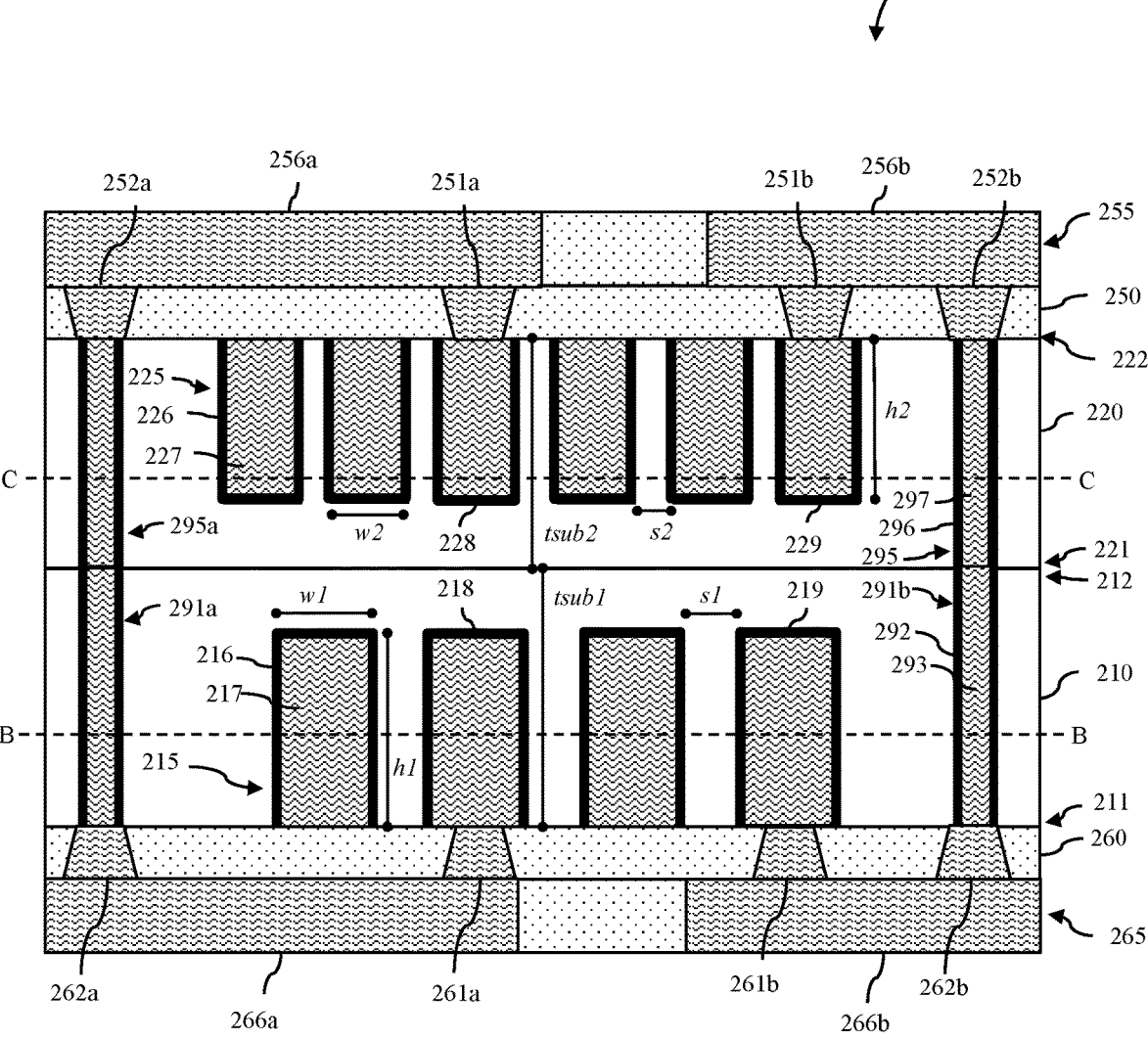
FIGS. 3A-3C are cross-section diagrams illustrating yet another disclosed semiconductor structure embodiment.
Figure 3B:
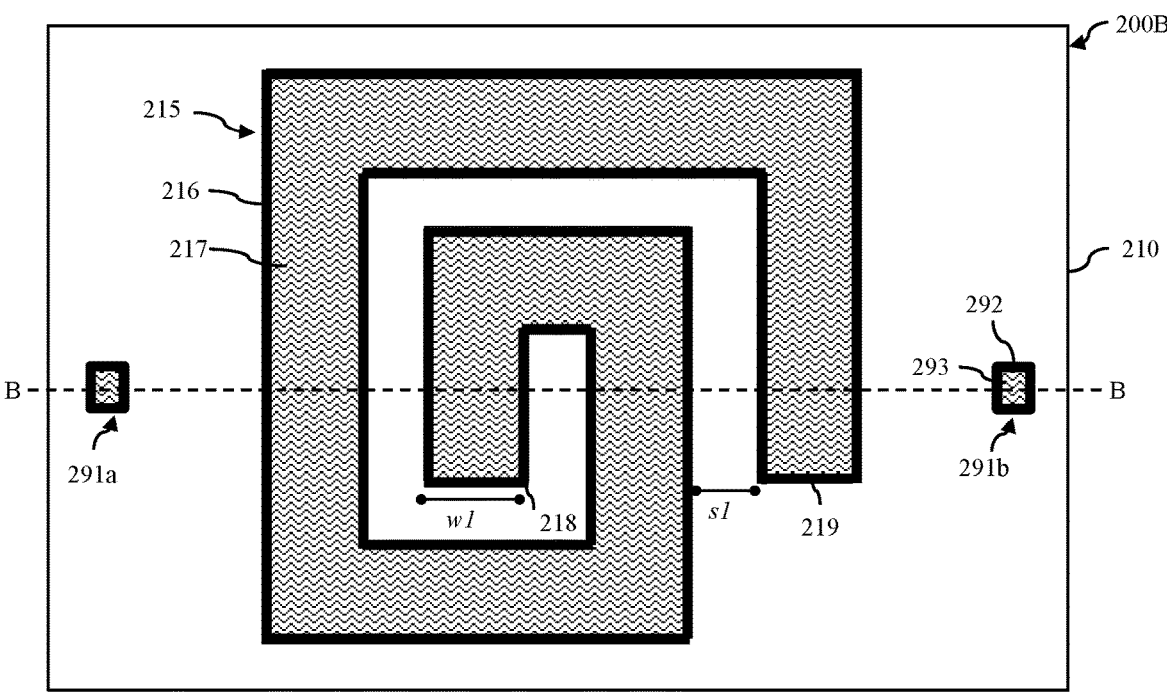
Figure 3C:
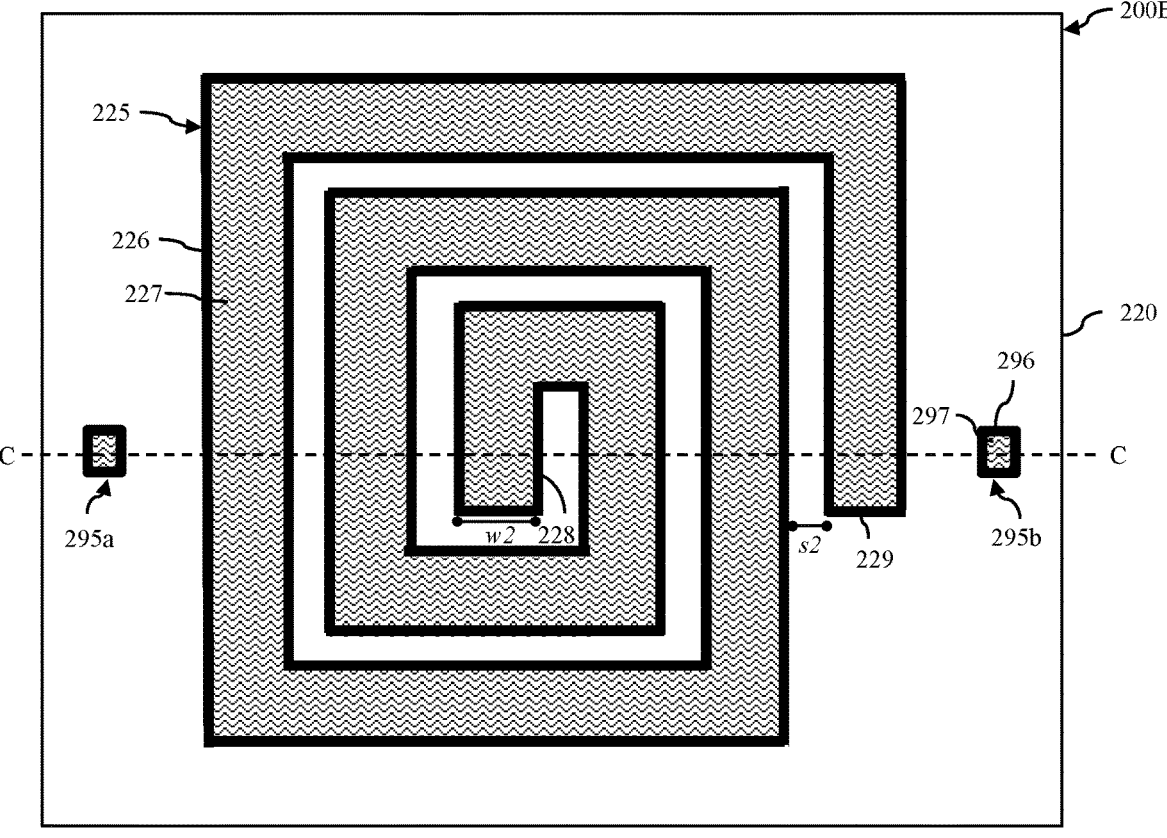
Figure 5A:
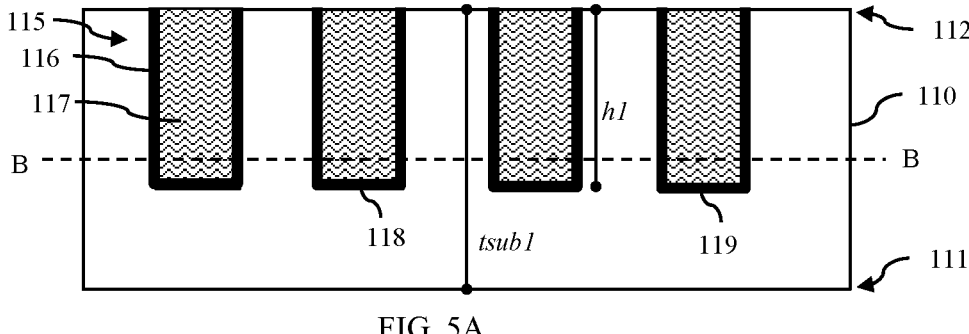
FIGS. 5A-9 are cross-section diagrams illustrating partially completed semiconductor structures formed according to the flow diagram of FIG. 4.
Figure 5B:
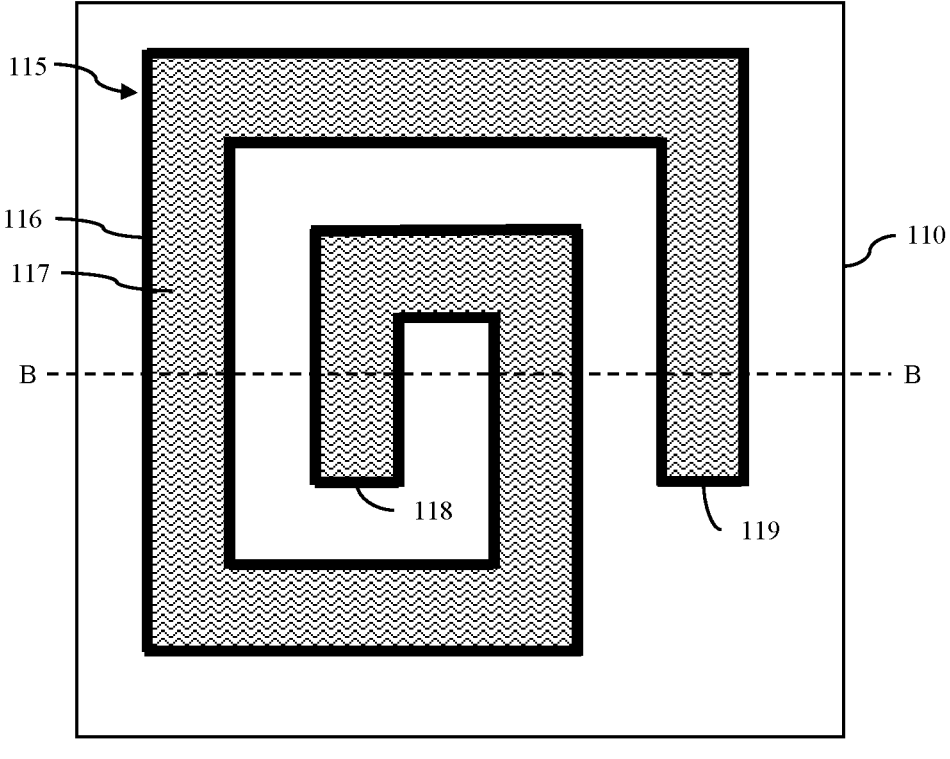
Figure 6A:
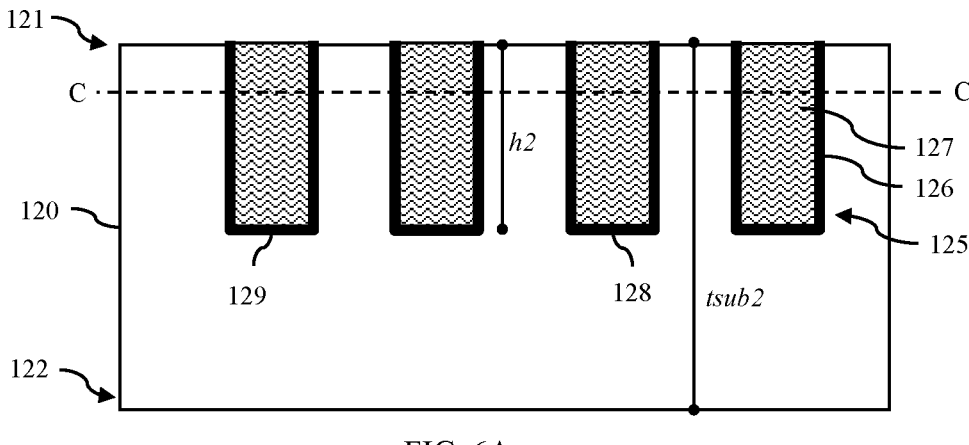
Figure 6B:
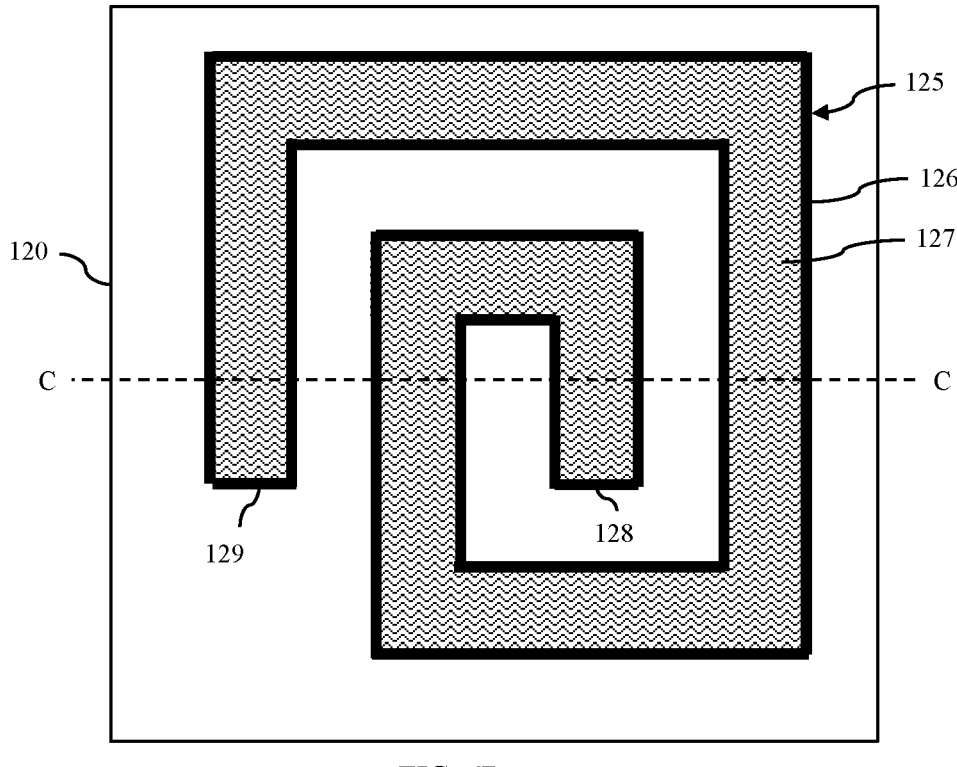

More particularly, FIG. 1A is a vertical cross-section diagram through a disclosed embodiment of a semiconductor structure 100 and FIGS. 1B and 1C are different horizontal cross-sections through the same semiconductor structure 100. FIG. 2A is a vertical cross-section diagram through another disclosed embodiment of a semiconductor structure 200A and FIGS. 2B and 2C are different horizontal cross-sections through the same semiconductor structure 200A. FIG. 3A is a vertical cross-section diagram through a semiconductor structure 200B, which is like the semiconductor structure 200A with variations as discussed below, and FIGS. 3B and 3C are different horizontal cross-sections through the same semiconductor structure 200B.

Referring to FIGS. 1A-1C, 2A-2C and 3A-3C, in each of the disclosed embodiments, the semiconductor structure 100, 200A and 200B can include a pair of semiconductor substrates. More specifically, each semiconductor structure 100, 200A and 200B can include a first semiconductor substrate 110, 210 and a second semiconductor substrate 120, 220. The first semiconductor substrate 110, 210 can have first surfaces 111-112, 211-212 (also referred to herein as first opposing surfaces). The second semiconductor substrate 120, 220 can have second surfaces 121-122, 221-222 (also referred to herein as second opposing surfaces). The second semiconductor substrate 120, 220 can be stacked above and in contact with the first semiconductor substrate 110, 210 such that one of the first surfaces (see first surface 112, 212) of the first semiconductor substrate 110, 210 is immediately adjacent to one of the second surfaces (see second surface 121, 221) of the second semiconductor substrate 120, 210. The adjacent surfaces of the first and second semiconductor substrates (i.e., the first surface 112, 212 of the first semiconductor substrate 110, 210 and the second surface 121, 221 of the second semiconductor substrate 120, 220) can, for example, be direct bonded to each other such that they are referred to herein as bonded surfaces.

The semiconductor materials of the first and second semiconductor substrates could include the same or different semiconductor materials. In some embodiments, the first semiconductor substrate 110, 210 and the second semiconductor substrate 120, 220 can both be monocrystalline silicon substrates. In other embodiments, a first semiconductor material for the first semiconductor substrate 110, 210 and a second semiconductor material for the second semiconductor substrate 120, 220 can each be selected from a group of semiconductor materials such that they made of the same or different semiconductor materials. As discussed in greater detail below regarding the method embodiments, the semiconductor materials in this group should only contain semiconductor materials suitable for direct surface bonding (e.g., silicon, germanium, silicon germanium, or any other suitable semiconductor material).

The first semiconductor substrate 110, 210 can have a first thickness (tsub1), as measured between the first surfaces 111-112, 211-212 and the second semiconductor substrate 120, 220 can have a second thickness (tsub2), as measured between the second surfaces 121-122, 221-222. The first thickness (tsub1) and the second thickness (tsub2) can be the same or different, but both can be relatively thick. For example, the first thickness (tsub1) and the second thickness (tsub2) can each range, for example, from 5 microns (μm) to 250 μm or even larger (e.g., 750 μm or higher). As discussed in greater detail below, these first and second thicknesses can vary depending upon the embodiment.

The semiconductor structure 100, 200A and 200B can further include at least two planar spiral-shaped metallic features that are stacked one above the other and electrically connected. That is, the semiconductor structure 100, 200A and 200B can include at least a first spiral-shape metallic feature 115, 215 in the first semiconductor substrate 110, 210 and a second spiral-shaped metallic feature 125, 225 in the second semiconductor substrate 120, 220 overlaying and electrically connected to the first spiral-shaped metallic feature 115, 215.

The disclosed embodiments of the semiconductor structure 100, 200A and 200B can vary as to the positions of the spiral-shaped metallic features within the semiconductor substrates and relative to each other, as to the shapes and dimensions thereof, and as to how they are electrically connected (as illustrated in the figures and discussed in greater detail below).

Referring specifically to FIGS. 1A-1C, in the semiconductor structure 100 the first spiral-shaped metallic feature 115 can be within the first semiconductor substrate 110 immediately adjacent to the first surface 112 (and particularly to the bonded surfaces) and separated from the other first surface 111 by a portion of the first semiconductor substrate 110. The first spiral-shaped metallic feature 115 can have a planar spiral shape. For purposes of illustration, the spiral shape is shown in FIGS. 1B-1C as being square. However, it should be understood that the figures are not intended to be limiting and, alternatively, it could have any suitable planar spiral shape (e.g., circular, octagonal, hexagonal, etc.) The first spiral-shaped metallic feature 115 can include a first spiral-shaped opening (also referred to herein as a spiral-shaped trench) that extends into the first semiconductor substrate 110 from the first surface 112 but not completely through the first semiconductor substrate 110. That is, in this embodiment, the first height (h1) of the first spiral-shaped metallic feature 115 is less than the first thickness (tsub1) of the first semiconductor substrate 110. For example, h1 can range from 5 μm to 250 μm or larger and tsub1 can be greater than h1 (e.g., 750 μm). First horizontal and vertical surfaces of the first spiral-shaped opening (i.e., an end wall and sidewalls of the first spiral-shaped opening) can be lined with one or more liner material layers including at least one first dielectric liner 116. A first metallic fill material 117 can be on the first dielectric liner 116 (to be electrically isolated from the first semiconductor substrate) and can fill the remaining space within the first spiral-shaped opening. The top of the first spiral-shaped metallic feature 115 and, particularly, the top of the first metallic fill material 117 can be essentially coplanar with the first surface 112 of the first semiconductor substrate 110.

The second spiral-shaped metallic feature 125 can be within and can extend completely through the second semiconductor substrate 120 between the second surfaces 121-122. Thus, in this embodiment the second height (h2) of the second spiral-shaped metallic feature 125 is the same as than the second thickness (tsub2) of the second semiconductor substrate 120. For example, h2 and tsub2 is the same and can range from 5 µm to 250 µm. Vertical surfaces of the second spiral-shaped opening (i.e., the sidewalls of the second spiral-shaped opening) can be lined with one or more liner material layers including at least one second dielectric liner 126. A second metallic fill material 127 can fill the remaining space within the second spiral-shaped opening and can be electrically isolated from the second semiconductor substrate 120 by the second dielectric liner 126. The bottom of the second spiral-shaped metallic feature 125 and, particularly, the bottom of the second metallic fill material 127 can be essentially co-planar with the second surface 121. The top of the second spiral-shaped metallic feature 125 and, particularly, the top of the second metallic fill material 127 can be essentially co-planar with the second surface 122.

In any case, in this embodiment, the second spiral-shaped metallic feature 125 and the first spiral-shaped metallic feature 115 can have essential identical horizontal cross-sections, as shown in FIGS. 1B and 1C. That is, they can have essentially the same planar spiral shape with the same dimensions in their respective horizontal cross-sections. Specifically, they can have the same end-to-end lengths (as measured from the first inner end 118 to the first outer end 119 of feature 115 and as measured form the second inner end 128 to the second outer end 129 of the feature 125), the same numbers of turns, the same wire widths (i.e., the first width (w1) of the first spiral-shaped metallic feature 115 is the same as the second width (w2) of the second spiral-shaped metallic feature 125), and the same wire spacings (i.e., the first wire spacing (s1) in the first spiral-shaped metallic feature 115 is the same as the second wire spacing (s2) in the second spiral-shaped metallic feature 125). However, the heights of the two spiral-shaped metallic features can be the same or different (i.e., the first height (h1) of the first spiral-shaped metallic feature 115 can be the same as or different from the second height (h2) of the second spiral-shaped metallic feature 125).

As mentioned above, the second semiconductor substrate 120 can be stacked on the first semiconductor substrate 110 and the second surface 121 of the second semiconductor substrate 120 can be direct bonded to the first surface 112 of the first semiconductor substrate 110. Additionally, the second spiral-shaped metallic feature 125 can be aligned directly above the first spiral-shaped metallic feature 115 such that the second spiral-shaped metallic feature 125 and, particularly, the second metallic fill material 127 thereof is immediately adjacent to the first spiral-shaped metallic feature 115 and, particularly, to the first metallic fill material 117 thereof. Thus, in combination, the first spiral-shaped metallic feature 115 and the second spiral-shaped metallic feature 125 effectively form a single, relatively, tall inductor 130 with an overall height equal to the combined heights (i.e., h1+h2) of the first spiral-shaped metallic feature 115 and the second spiral-shaped metallic feature 125.

The semiconductor structure 100 can further include at least one dielectric layer 150 on the second surface 122 of the second semiconductor substrate 120 opposite the bonded surfaces.

The dielectric layer 150 can include, for example, one or more layers of interlayer dielectric (ILD) material. The ILD material can include, for example, a relatively thin etch stop layer (e.g., a silicon nitride (SiN)) layer immediately adjacent to the second surface 122 and covering the second spiral-shaped metallic feature 125 and a blanket dielectric layer (e.g., a thick layer of silicon dioxide, doped silicon glass, such as phosphosilicate glass (PSG) or borophosphosilicate glass (BPSG), etc.) on the etch stop layer.

The semiconductor structure 100 can further include contacts extending through the dielectric layer 150 to the inductor 130. These contacts can include input and output terminal contacts 151a and 151b to the second spiral-shaped metallic feature 125 at the second inner and outer ends 128 and 129, respectively. The semiconductor structure 100 of FIGS. 1A-1C can further include additional back end of the line (BEOL) metal levels 155 with various interconnects (e.g., wires and/or vias) for electrically connecting the input and output terminal contacts 151a-151b to other integrated circuit (IC) components on the bonded first and second semiconductor substrates 110 and 120.

Given the configuration of the inductor 130 with stacked directly bonded spiral-shaped metallic features within the bonded semiconductor substrates 110 and 120, this inductor 130 can have a relatively high $Q_{dc}$ within a relatively small chip area. Since, as mentioned above $Q_{dc}=\omega\ L_{dc}/R_{dc}$, the dimensions of the inductor 130 (including the overall height, the number of turns, the spiral shape, the wire width, and the wire width) and the metallic fill material(s) used (as discussed in greater detail below) can be determined during design to fine tune the $Q_{dc}$ to a desired relatively high level.

Referring specifically to FIGS. 2A-2C and 3A-3C, in the semiconductor structure 200A and 200B, the first spiral-shaped metallic feature 215 can be within the first semiconductor substrate 210 at the first surface 211 and physically separated from the first surface 212 (and thereby physically separated from the bonded surfaces of the two semiconductor substrates) by a portion of the first semiconductor substrate 210. The first spiral-shaped metallic feature 215 can have a planar spiral shape. However, it should be understood that the figures are not intended to be limiting and, alternatively, it could have any suitable planar spiral shape (e.g., circular, octagonal, hexagonal, etc.). The first spiral-shaped metallic feature 215 can include a first spiral-shaped opening (also referred to herein as a spiral-shaped trench) that extends into the first semiconductor substrate 210 from the first surface 211 but not completely through to the first semiconductor substrate 210. That is, in this embodiment, the first height (h1) of the first spiral-shaped metallic feature 215 is less than the first thickness (tsub1) of the first semiconductor substrate 210. For example, h1 can range from 5 µm to 250 µm or larger and tsub1 can be greater than h1 (e.g., 750 µm). First horizontal and vertical surfaces of the first spiral-shaped opening (i.e., an end wall and sidewalls of the first spiral-shaped opening) can be lined with one or more liner material layers including at least one first dielectric liner 216. A first metallic fill material 217 can be on the first dielectric liner 216 (and, thus, be electrically isolated from the first semiconductor substrate 210) and can fill the remaining space within the first spiral-shaped opening. The bottom of the first spiral-shaped metallic feature 215 and, particularly, the bottom of the first metallic fill material 217 can be essentially coplanar with the first surface 211 of the first semiconductor substrate 210.

The second spiral-shaped metallic feature 225 can be within the second semiconductor substrate 220 at the second surface 222 and physically separated from the second surface 221 (and thereby physically separated from the bonded surfaces of the two semiconductor substrates) by a portion of the second semiconductor substrate 220. The second spiral-shaped metallic feature 225 can have a planar spiral shape, as discussed in greater detail below. The second spiral-shaped metallic feature 225 can include a second spiral-shaped opening that extends into the second semiconductor substrate 220 from the second surface 222 but not completely through the second semiconductor substrate 220. That is, in this embodiment, the second height (h2) of the second spiral-shaped metallic feature 221515 is less than the second thickness (tsub2) of the second semiconductor substrate 220. For example, h2 can range from 5 μm to 250 μm or larger and tsub2 can be greater than h2 (e.g., 750 μm). Horizontal and vertical surfaces of the second spiral-shaped opening (i.e., an end wall and sidewalls of the second spiral-shaped opening) can be lined with one or more liner material layers including at least one second dielectric liner 226. A second metallic fill material 227 can fill the remaining space within the second spiral-shaped opening and can be electrically isolated from the second semiconductor substrate 220 by the second dielectric liner 226. The top of the second spiral-shaped metallic feature 225 and, particularly, the top of the second metallic fill material 227 can be essentially co-planar with the second surface 222 of the second semiconductor substrate 220. As illustrated, the second spiral-shaped metallic feature 225 within the second semiconductor substrate 220 can overlay the first spiral-shaped metallic feature 215 within the first semiconductor substrate 210; however, due to their placement at opposite sides of the bonded semiconductor substrates (i.e., physically separated from the bonded surfaces of the two semiconductor substrates), they are physically separated from each other and, thereby discrete inductors (i.e., a first inductor and a second inductor, respectively).

In the semiconductor structure 200A of FIGS. 2A-2C and 200B of FIGS. 3A-3C, the first and second spiral-shaped metallic features 215, 225 (i.e., the first inductor and the second inductor) can be electrically connected in parallel instead of being directly bonded as in the semiconductor structure 100 of FIGS. 1A-1C.

More specifically, the first spiral-shaped metallic feature 215 (i.e., the first inductor) can have a first inner end 218 and a first outer end 210 and the second spiral-shaped metallic feature 225 can similarly have a second inner end 228 and a second outer end 229. Two first through substrate vias (TSVs) 291a-291b can extend completely through the first semiconductor substrate 210 between the first surfaces 211-212. The first spiral-shaped metallic feature 215 can be positioned laterally between and electrically isolated from the first TSVs 291. The first TSVs 291a-291b can each include a first TSV opening that extends through the first semiconductor substrate, has vertical surfaces (i.e., sidewalls) lined with one or more liner material layers including at least one first TSV dielectric liner 292, and is filled with a first TSV metallic fill material 293. Two second TSVs 295a-295b can extend completely through the second semiconductor substrate 220 between the second surfaces 221-222. The second spiral-shaped metallic feature 225 can be positioned laterally between and electrically isolated from the second TSVs 295. The second TSVs 295 can each include a second TSV opening that extends through the second semiconductor substrate, has vertical surfaces (i.e., sidewalls) lined with one or more liner material layers including at least one second TSV dielectric liner 296, and is filled with a second TSV metallic fill material 297. Each second TSV 295a-295b can be vertically aligned with a corresponding first TSV 291a-291b below and directly bonded thereto at the bonded surfaces of the two semiconductor substrates, and thereby electrically connected.

The semiconductor structure 200A and 200B can further include a first dielectric layer 260 on the first surface 211 of the first semiconductor substrate 210 (i.e., opposite the bonded surfaces and covering the first spiral-shaped metallic feature 215) and a second dielectric layer 250 on the second surface 222 of the second semiconductor substrate 220 (i.e., opposite the bonded surfaces and covering the second spiral-shaped metallic feature 225). The first dielectric layer 260 and the second dielectric layer 250 can each include one or more layers of ILD material (e.g., an etch stop layer of, for example, SiN, immediately adjacent to the respective semiconductor substrate and a blanket dielectric layer, such as silicon dioxide or doped silicon glass, on the etch stop layer).

The semiconductor structure 200A and 200B can further include contacts extending through the first and second dielectric layers. These contacts can include: first input and output terminal contacts 261a and 261b to the first spiral-shaped metallic feature 215 at the first inner and outer ends 218 and 219, respectively; and first TSV contacts 262a and 262b to the first TSVs 291a and 291b, respectively. These contacts can also include: second input and output terminal contacts 251a and 251b to the second spiral-shaped metallic feature 225 at the second inner and outer ends 228 and 229, respectively; and second TSV contacts 252a and 252b the second TSVs 295a and 295b, respectively. The semiconductor structure 200A and 200B can further include first BEOL metal levels 265 (also referred to herein as backside BEOL metal levels) adjacent to the first dielectric layer 260 and second BEOL metal levels 265 (also referred to herein as front side BEOL metal levels) adjacent to the second dielectric layer 250. The first BEOL metal levels 265 can include various first interconnects 266a and 266b (e.g., wires and/or vias), which are within BEOL dielectric layers, which electrically connect the first TSV contact 262a (and thereby the first TSV 291a) to the first input terminal contact 261a (and thereby the first inner end 218) and which also electrically connect the first TSV contact 262b (and thereby the first TSV 291b) to the first output terminal contact 261b (and thereby the first outer end 219). Similarly, the second BEOL metal levels 255 can include various second interconnects 256a and 256b (e.g., wires and/or vias), which are within BEOL dielectric layers, which electrically connect the second TSV contact 252a (and thereby the second TSV 295a) to the second input terminal contact 251a (and thereby the second inner end 228) and which also electrically connect the second TSV contact 252b (and thereby the second TSV 295b) to the second output terminal contact 251b (and thereby the second outer end 229). With such a configuration of interconnects, the first spiral-shaped metallic feature 215 (i.e., the first inductor) and the second spiral-shaped metallic feature 225 (i.e., the second inductor) are electrically connected in parallel and, thereby effectively function as a single relatively large inductor. Additional interconnects in the first and/or second BEOL metal levels can further electrically connect this parallel inductor circuit to other IC components on the bonded first and second semiconductor substrates 210 and 220.

As mentioned above, in the semiconductor structure 200A and 200B both the first spiral-shaped metallic feature 215 and the second spiral-shaped metallic feature 225 can each have a spiral shape (e.g., square, circular, octagonal, hexagonal, etc.). As illustrated in the semiconductor structure 200A of FIGS. 2A-2C, in some embodiments the second spiral-shaped metallic feature 225 and the first spiral-shaped metallic feature 215 can have essentially identical horizontal cross-sections. That is, they can have essentially the same planar spiral shape with the same dimensions in their respective horizontal cross-sections. Specifically, they can have the same spiral shape, the same end-to-end lengths (as measured from the first inner end 218 to the first outer end 219 of feature 215 and as measured form the second inner end 228 to the second outer end 229 of the feature 225), the same numbers of turns, the same wire widths (i.e., w1=w2), and the same wire spacings (i.e., s1=s2). In these embodiments, the heights h1 and h2 of the two spiral-shaped metallic features 215 and 225 can be the same or different. However, since, as mentioned above, the first spiral-shaped metallic feature 215 and the second spiral-shaped metallic feature 225 are stacked but electrically connected in parallel as opposed to being direct bonded, they could have different horizontal cross-sections, as illustrated in the semiconductor structure 200B of FIGS. 3A-3B. Specifically, they could have different spiral shapes (not shown), different end-to-end lengths (as measured from the first inner end 218 to the first outer end 219 of feature 215 and as measured form the second inner end 228 to the second outer end 229 of the feature 225), different numbers of turns, different wire widths (e.g., w1≠w2) and/or different wire spacings (e.g., s1≠s2). Also, as with the previous embodiments, the heights h1 and h2 of the two spiral-shaped metallic features 215 and 225 can be the same or different. It should also be noted that in these embodiments the thicknesses tsub1 and tsub2 of the two semiconductor substrates could be the same or different.

Given the configuration of the stacked and parallel-connected first and second spiral-shaped metallic features 215, 225 (i.e., the stacked parallel-connected first and second inductors) within the bonded semiconductor substrates 210 and 220, this resulting inductor circuit can have a relatively high $Q_{dc}$ within a relatively small chip area. Since, as mentioned above $Q_{dc}=\omega L_{dc}/R_{dc}$, the dimensions of the two spiral-shaped metallic features 215, 225 (including the respective heights, numbers of turns, spiral shapes, wire widths, and wires spacings) and the metallic fill material(s) used (as discussed in greater detail below) can be determined during design to adjust the $Q_{dc}$ to a desired relatively high level.

Referring again to FIGS. 1A-1C, 2A-2C, and 3A-3C, as mentioned above, the semiconductor structure 100, 200A and 200B can include various dielectric liners lining openings for spiral-shaped metallic features and/or via openings for TSVs. For example, in the semiconductor structure 100, 200A and 200B, each first spiral-shaped metallic feature 115, 215 can include a first dielectric liner 116, 216 and each second spiral-shaped metallic feature 125, 225 can include a second dielectric liner 126, 226. Furthermore, in the semiconductor structure 200A and 200B, the first TSVs 291a-291b can each have a first TSV dielectric liner 292 and the second TSVs 295a-295b can each have a second TSV dielectric liner 296. These dielectric liners can all be made of the same dielectric liner material (e.g., silicon dioxide or some other suitable dielectric liner material). Alternatively, the dielectric liners used on the different semiconductor substrates could be different. Alternatively, the dielectric liners used for the spiral-shaped metallic features could be different from those used for the TSVs.

Also, as mentioned above, the semiconductor structure 100, 200A and 200B can include various metallic fill materials within openings for spiral-shaped metallic features and/or filling via openings for TSVs. For example, in the semiconductor structure 100, 200A and 200B, each first spiral-shaped metallic feature 115, 215 can include a first metallic fill material 117, 217 and each second spiral-shaped metallic feature 125, 225 can include a second metallic fill material 127, 227. Furthermore, in the semiconductor structure 200A and 200B, the first TSVs 291a-291b can each have a first TSV metallic fill material 293 and the second TSVs 295a-295b can each have a second TSV metallic fill material 297. These metallic fill materials can all be made of the same metallic material (e.g., copper or some other suitable low resistance metal or metal alloy). Alternatively, the metallic fill materials used on the different semiconductor substrates could be different. Alternatively, the metallic fill materials used for the spiral-shaped metallic features could be different from those used for the TSVs.

As noted above, the semiconductor, metallic and dielectric materials on the different semiconductor substrates could, optionally, be different. However, those skilled in the art will recognize that with currently available direct bonding techniques bonding quality is improved when the bonded materials are the same (e.g., when semiconductor materials are the same in semiconductor-to-semiconductor bonding, when dielectric materials are the same in dielectric-to-dielectric bonding, and when metal materials are the same in metal-to-metal bonding). Thus, in preferred embodiments, the bonded semiconductor substrates are made of the same semiconductor material (e.g., silicon) for optimal bonding. Furthermore, in the preferred embodiments, when liner materials and metallic fill materials of the spiral-shaped metallic features and, optionally, of the TSVs are exposed at the bonded surfaces of the semiconductor substrates, the liner materials will be the same (e.g., silicon dioxide) to facilitate bonding and, similarly, the metallic fill materials will be the same (e.g., copper) to facilitate bonding.

FIG. 4 is a flow diagram illustrating an embodiment of a method of forming a semiconductor structure, such as the semiconductor structure 100 of FIGS. 1A-1C. The method can include providing a pair of semiconductor wafers (see process 402 and FIGS. 5A-5B and 6A-6B). The semiconductor wafers can include a first semiconductor wafer for a first semiconductor substrate 110 and a second semiconductor wafer for a second semiconductor substrate 120. The semiconductor materials of the first and second semiconductor wafers could include the same or different semiconductor materials. In some embodiments, the first and second semiconductor wafers can be bulk monocrystalline silicon wafers. Alternatively, the first and second semiconductor wafers could include another semiconductor material (e.g., germanium or silicon germanium or any other semiconductor materials suitable for direct surface bonding at process 406, discussed below). Alternatively, the first and second semiconductor wafers could include different semiconductor materials, if the combination of semiconductor materials is suitable for direct surface bonding at process 406, discussed below. In any case, these semiconductor wafers can be relatively thick with thicknesses ranging, for example, from 10 μm to 250 μm or even larger (e.g., 750 μm or higher).

The first semiconductor substrate 110 can have first surfaces 111-112 (also referred to herein as first opposing surfaces). The method can include forming a first spiral-shaped metallic feature 115 within the first semiconductor substrate 110 at the first surface 112 but not extending completely through the first semiconductor substrate 110 (see process 404A and FIGS. 5A-5B). Specifically, a first spiral-shaped opening (also referred to herein as a spiral-shaped trench) can be formed (e.g., lithographically patterned and etched) such that it extends some predetermined depth into the first semiconductor substrate 110 from the first surface 112 but not through to the first surface 111. A first dielectric liner 116 (e.g., a silicon dioxide liner or some other suitable dielectric liner material) can be conformally deposited so as line first horizontal and vertical surfaces (i.e., an end wall and sidewalls) of the first spiral-shaped opening. A first metallic fill material 117 (e.g., a low resistance metal or metal alloy) can be deposited to fill remaining space within the first spiral-shaped opening. For example, an electroplating process can be used to fill the remaining space with copper. A chemical mechanical polishing (CMP) process can further be performed to remove the dielectric and metal fill materials from the first surface 112 such that an exposed surface the first spiral-shaped metallic feature 115 and, particularly, an exposed surface of the first metallic fill material 117 (e.g., copper) is essentially coplanar with the first surface 112 of the first semiconductor substrate 110.

The second semiconductor substrate 120 can have second surfaces 121-122 (also referred to herein as second opposing surfaces). The method can further include forming a second spiral-shaped metallic feature 125 within the second semiconductor substrate 120 at the second surface 121 and physically separated from the second surface 122 (see process 404B and FIGS. 6A-6B). Specifically, a second spiral-shaped opening can be formed (e.g., lithographically patterned and etched) such that it extends into the second semiconductor substrate 120 from the second surface 121 without extending completely through the second semiconductor substrate 120. A second dielectric liner 126 (e.g., a silicon dioxide liner or some other suitable dielectric liner material) can be conformally deposited so as line second horizontal and vertical surfaces (i.e., an end wall and side-walls) of the second spiral-shaped opening. A second metallic fill material 127 (e.g., a low resistance metal or metal alloy) can be deposited to fill remaining space within the second spiral-shaped opening. For example, an electroplating process can be used to fill the remaining space with copper. A CMP process can further be performed to remove the dielectric and metal fill materials from the second surface 121 such that an exposed surface of the second spiral-shaped metallic feature 125 and, particularly, of the second metallic fill material 127 (e.g., copper) is essentially coplanar with the second surface 121 of the second semiconductor substrate 120.

It should be noted that lithographic patterning of the first and second spiral-shaped openings for the first and second spiral-shaped metallic features 115, 125 should be performed at processes 404A-404B such that the resulting first and second spiral-shaped metallic features have substantially identical horizontal cross-sections when the second semiconductor substrate is flipped, as shown in FIGS. 1B and 1C. Specifically, processes 404A-404B can be performed so that these features have the same end-to-end lengths (as measured from the first inner end 118 to the first outer end 119 of feature 115 and as measured form the second inner end 128 to the second outer end 129 of the feature 125), the same numbers of turns, the same wire widths (i.e., the first width (w1) of the first spiral-shaped metallic feature 115 is the same as the second width (w2) of the second spiral-shaped metallic feature 125), and the same wire spacings (i.e., the first wire spacing (s1) in the first spiral-shaped metallic feature 115 is the same as the second wire spacing (s2) in the second spiral-shaped metallic feature 125). However, etching of the openings can be performed so that the heights of the two spiral-shaped metallic features are either the same or different (i.e., the first height (h1) of the first spiral-shaped metallic feature 115 can be the same as or different from the second height (h2) of the second spiral-shaped metallic feature 125).

Figure 7:
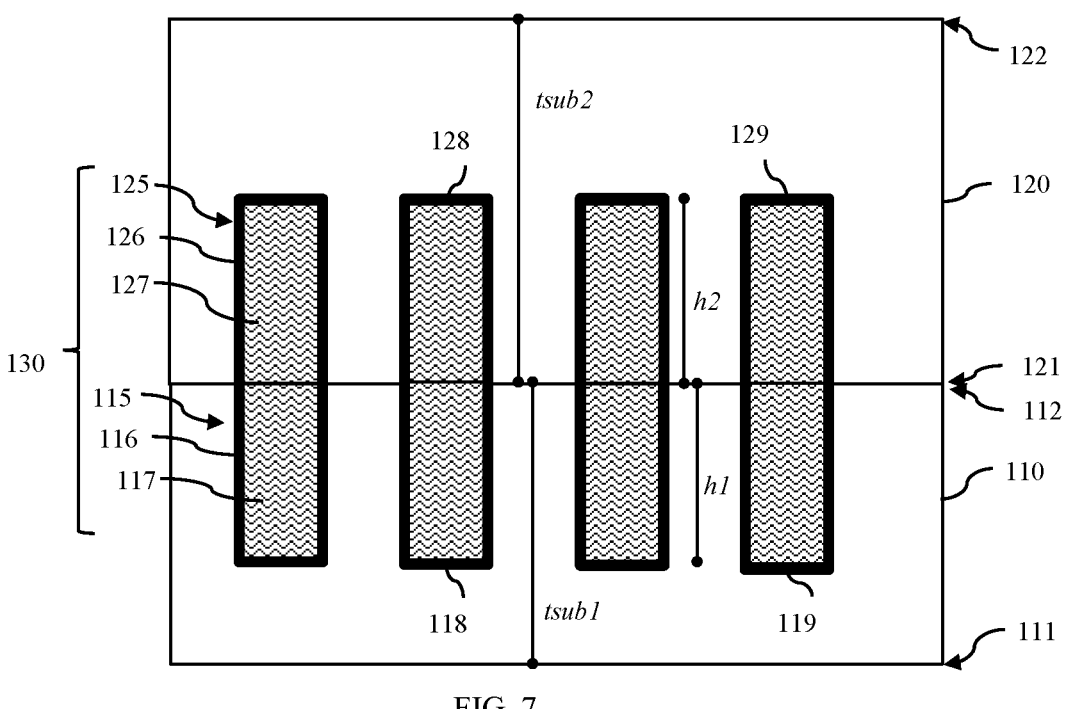

The method can further include flipping one of the semiconductor substrates (e.g., the semiconductor substrate 120), stacking the substrates so that the second surface 121 is immediately adjacent to the first surface 112 and further so that the second spiral-shaped metallic feature 125 is aligned and in contact with the first spiral-shaped metallic feature 115, and direct bonding (also referred to herein as fusion bonding) the adjacent surfaces together (see process 406 and FIG. 7). Wafer bonding at process 406 can include wafer preprocessing, pre-bonding at room temperature, and annealing at elevated temperatures. Alternatively, low temperature direct bonding could be performed. Such direct wafer bonding techniques are well known in the art and, thus, the details thereof have been omitted form this specification to allow the reader to focus on the salient aspects of the disclosed embodiments.

Figure 8:
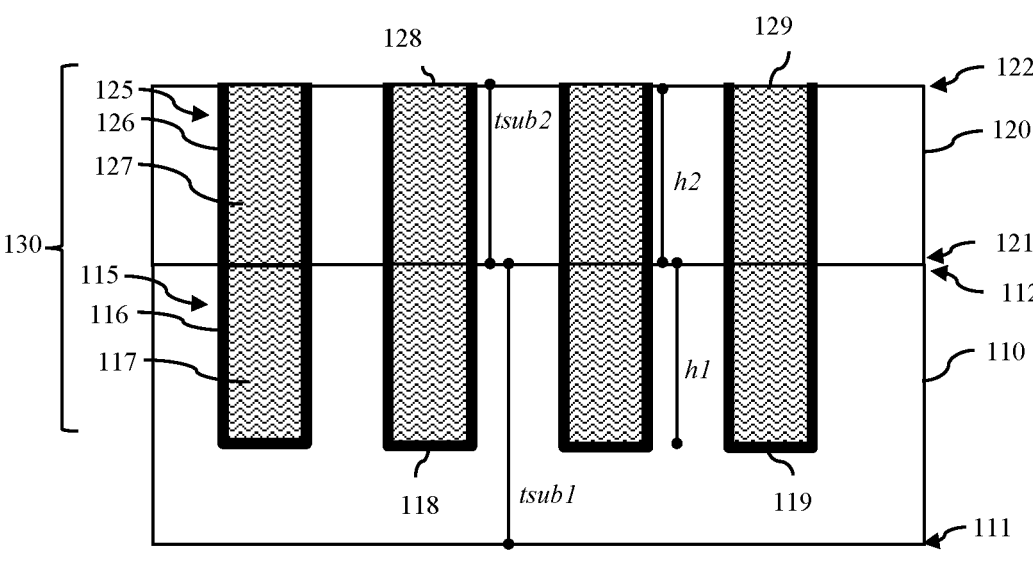
Figure 9:
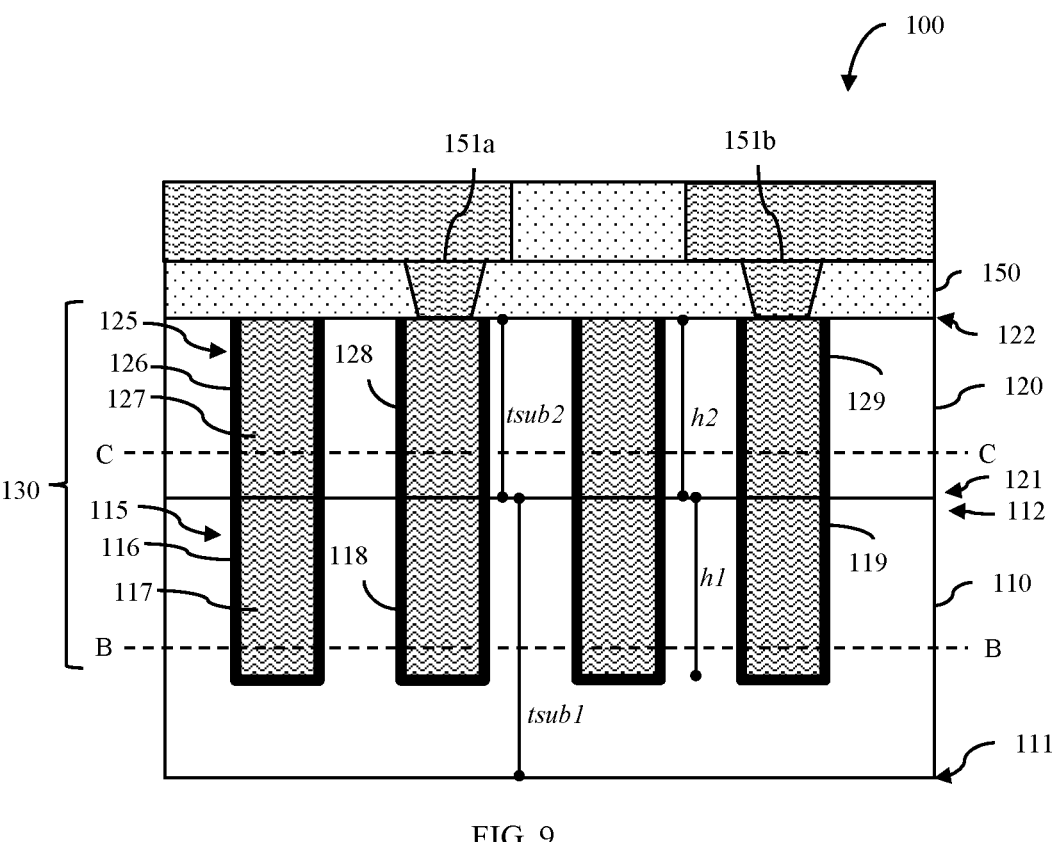

The method can further include performing another CMP process to expose the second spiral-shaped metallic feature 125 at the second surface 122 of the second semiconductor substrate 120, thereby reducing tsub2 (see process 408 and FIG. 8). Thus, following CMP at process 408, h2 of the second spiral-shaped metallic feature 125 and tsub2 of the second semiconductor substrate 120 will be the same, but h1 of the first spiral-shaped metallic feature 115 will still be less than tsub1 of the first semiconductor substrate 110. The resulting h2 and tsub2 can range, for example, between 5 μm to 250 μm. Next, a dielectric layer 150 can be formed on the second surface 122 of the second semiconductor substrate 120 over the exposed surface of the second spiral-shaped metallic feature 125 (see process 410 and FIG. 9). Subsequently, contacts can be formed that extend through the dielectric layer 150 to the second spiral-shaped metallic feature 125 (see process 412 and FIG. 9). These contacts can include input and output terminal contacts 151a and 151b extending through the dielectric layer 150 the second inner end 128 and the second outer end 129, respectively, of the second spiral-shaped metallic features 125. Additionally, BEOL processing can be performed to form BEOL metal levels 155 with various interconnects (e.g., wires and/or vias) within BEOL dielectric layers (see process 414 and FIG. 9). Such interconnects can be formed at process 414 to electrically connect the input and output terminal contacts 151a-151b to other IC components on the bonded first and second semiconductor substrates 110 and 120. Techniques for forming contacts and for BEOL processing are well known in the art and, thus, the details thereof have been omitted from this specification to allow the reader to focus on the salient aspects of the disclosed methods.

In the above-described method, the first spiral-shaped metallic feature 115 and the second spiral-shaped metallic feature 125, in combination, effectively form a single, relatively, large inductor 130 having a relatively high $Q_{dc}$ within a relatively small chip area. Since, as mentioned above $Q_{dc}=\omega\,L_{dc}/R_{dc}$, at processes 404A-404B, the dimensions of the inductor 130 (including the overall height, the number of turns, the spiral shape, the wire width, and the wire width) and the metallic fill material(s) used (as discussed in greater detail below) can be selected during design to adjust the $Q_{dc}$ to a desired relatively high level.

Figure 10:
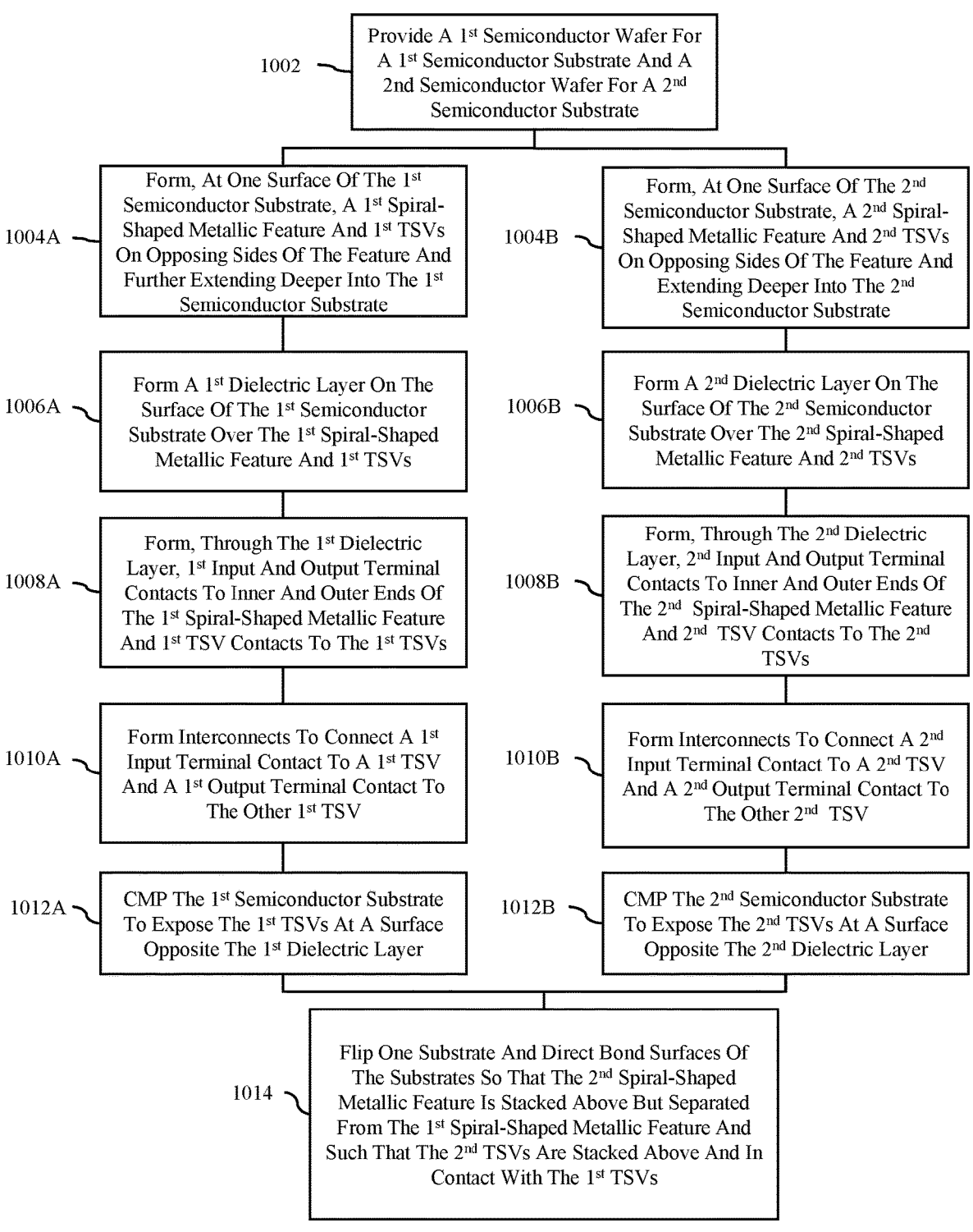
FIG. 10 is a flow diagram illustrating method embodiments for forming the semiconductor structure embodiment of FIGS. 2A-2C and the semiconductor structure embodiment of FIGS. 3A-3C.

FIG. 10 is a flow diagram illustrating an embodiment of a method of forming a semiconductor structure, such as the semiconductor structure 200A of FIGS. 2A-2C or 200B of FIGS. 3A-3C. The method can include providing a pair of semiconductor wafers (see process 1002 and FIGS. 5A-5B and 6A-6B). The semiconductor wafers can include a first semiconductor wafer for a first semiconductor substrate 210 and a second semiconductor wafer for a second semiconductor substrate 220. The semiconductor materials of the first and second semiconductor wafers could include the same or different semiconductor materials. In some embodiments, the first and second semiconductor wafers can be bulk monocrystalline silicon wafers. Alternatively, the first and second semiconductor wafers could include another semiconductor material (e.g., germanium or silicon germanium or any other semiconductor materials suitable for direct surface bonding at process 1014, discussed below). Alternatively, the first and second semiconductor wafers could include different semiconductor materials if those different semiconductor materials are suitable for direct surface bonding at process 1014, discussed below. In any case, these semiconductor wafers can be relatively thick with thicknesses ranging, for example, from 10 μm to 250 μm or even larger (e.g., 750 μm or higher).

Figure 11A:
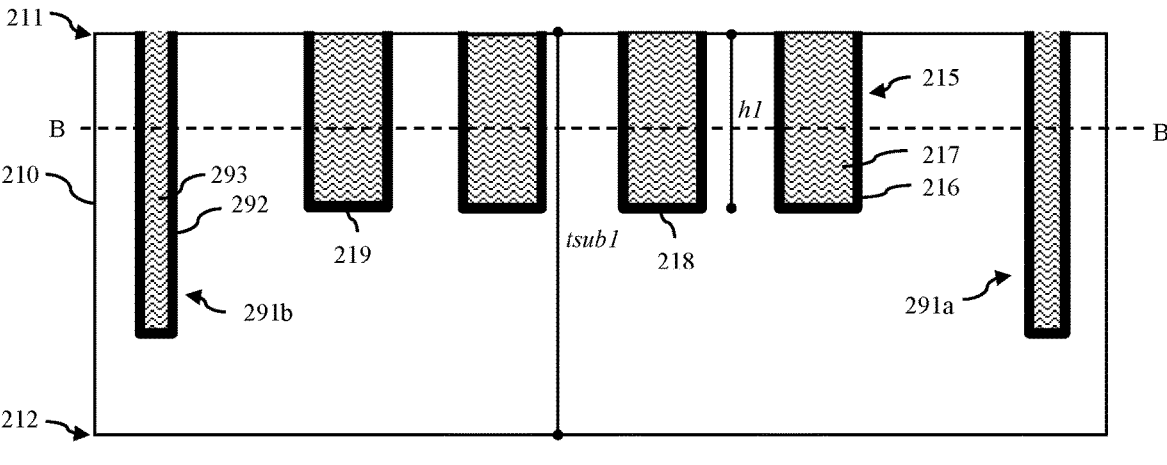
FIGS. 11A-17 are cross-section diagrams illustrating partially completed semiconductor structures formed according to the flow diagram of FIG. 10.
Figure 11B:
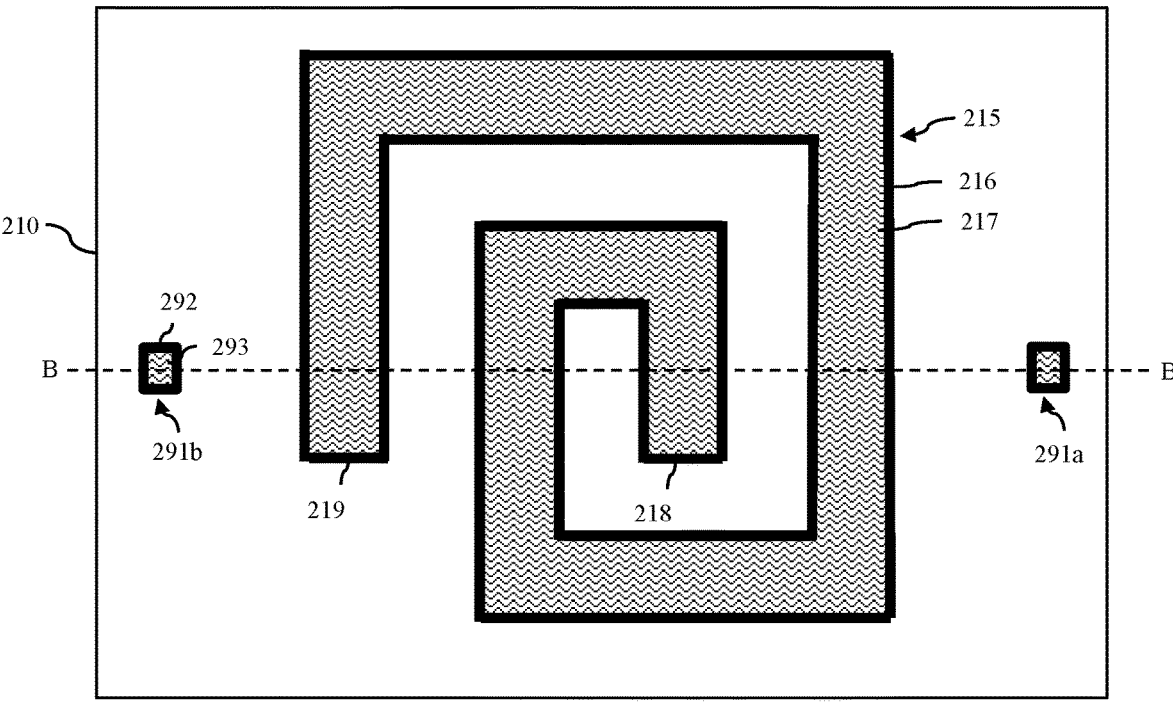

The first semiconductor substrate 210 can have first surfaces 211-212 (also referred to herein as first opposing surfaces). The method can include forming, within the first semiconductor substrate 210 at the first surface 211 and physically separated from the first surface 212, first TSVs 291a-291b and a first spiral-shaped metallic feature 215 positioned laterally between the first TSVs 291a-291b (see process 1004A and FIGS. 11A-11B). Specifically, a first spiral-shaped opening (also referred to herein as a spiral-shaped trench) can be formed (e.g., lithographically patterned and etched) such that it extends some predetermined depth into the first semiconductor substrate 210 from the first surface 212 but not completely through the first semiconductor substrate 210 to the first surface 211. First via openings for first TSVs can also be formed (e.g., lithographically patterned and etched) such that they extend some predetermined depth into the first semiconductor substrate 210 but not completely through the first semiconductor substrate 210 to the first surface 211. It should be noted that the first via openings should extend deeper into the first semiconductor substrate 210 than the first spiral-shaped opening. A dielectric liner material (e.g., silicon dioxide or some other suitable liner material) can be deposited to form a first dielectric liner 216 lining the first spiral-shaped opening and first TSV dielectric liners 292 lining the first via openings. A metallization process can be performed to form a first metallic fill material 217 (e.g., a low resistance metal or metal alloy) that fills the remaining space within the first spiral-shaped opening and first TSV metallic fill material 293 filling remaining space within the first via openings. For example, an electroplating process can be used to fill the remaining space in these openings with copper. A CMP process can further be performed to remove the dielectric and metallic fill materials from the first surface 211 such that surfaces of the first spiral-shaped metallic feature 215 and first TSVs 291a-291b are essentially coplanar with the first surface 211 of the first semiconductor substrate 210.

Figure 12A:
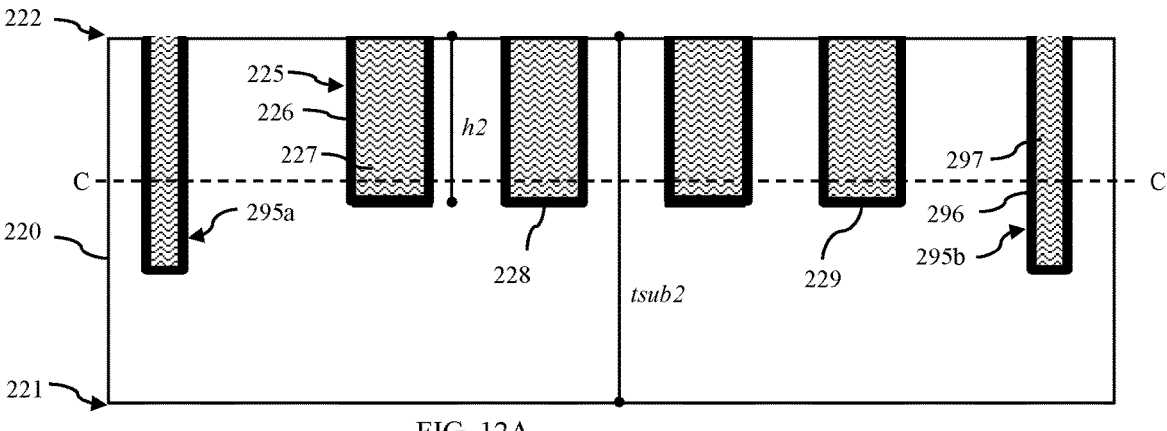
Figure 12B:
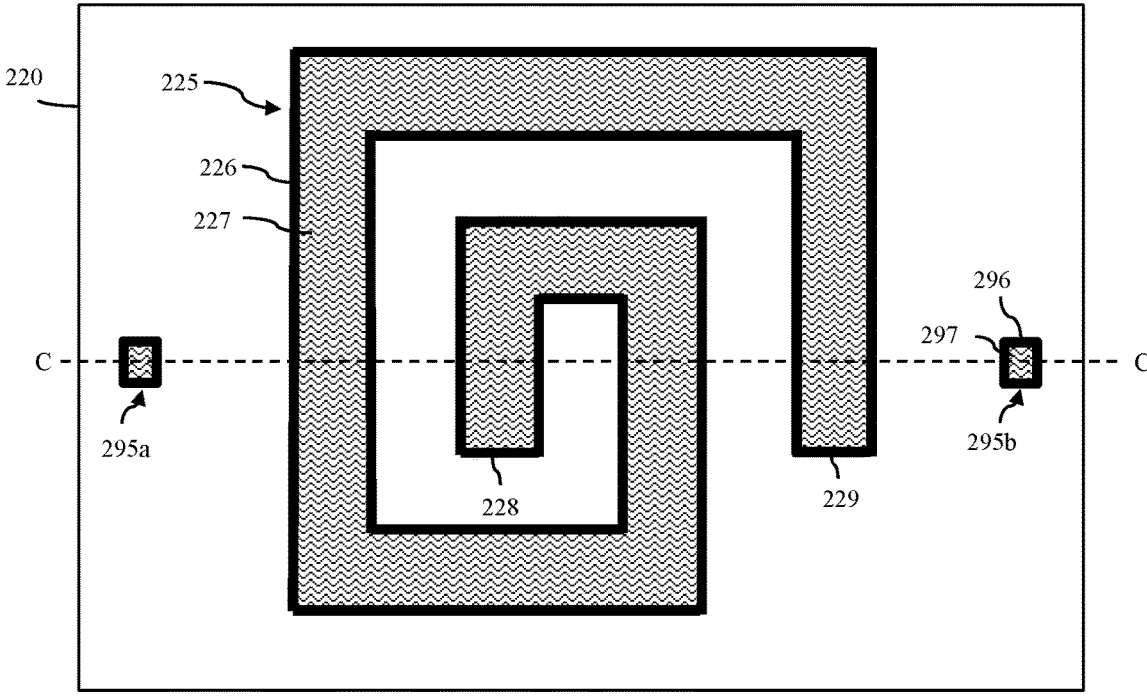

The second semiconductor substrate 220 can have second surfaces 221-222 (also referred to herein as second opposing surfaces). The method can include forming, within the second semiconductor substrate 220 at the second surface 222 and physically separated from the second surface 221, second TSVs 295a-295b and a second spiral-shaped metallic feature 225 positioned laterally between the second TSVs 295a-295b (see process 1004B and FIGS. 12A-12B). Specifically, a second spiral-shaped opening (also referred to herein as a spiral-shaped trench) can be formed (e.g., lithographically patterned and etched) such that it extends some predetermined depth into the second semiconductor substrate 220 from the second surface 222 but not completely through the second semiconductor substrate 220 to the second surface 221. Second via openings for second TSVs can also be formed (e.g., lithographically patterned and etched) such that they extend some predetermined depth into the second semiconductor substrate 220 from the second surface 222 but not through the second semiconductor substrate 220 to the second surface 221. It should be noted that the second via openings should extend deeper into the second semiconductor substrate 220 than the second spiral-shaped opening. A dielectric liner material (e.g., silicon dioxide or some other suitable liner material) can be deposited to form a second dielectric liner 226 lining the second spiral-shaped opening and second TSV dielectric liners 296 lining the second via openings. A metallization process can be performed to form a second metallic fill material 227 (e.g., a low resistance metal or metal alloy) that fills the remaining space within the second spiral-shaped opening and second TSV metallic fill material 297 filling remaining space within the second via openings. For example, an electroplating process can be used to fill the remaining space in these openings with copper. A CMP process can further be performed to remove the dielectric and metallic fill materials from the second surface 222 of the second semiconductor substrate 220 such that surfaces of the second spiral-shaped metallic feature 225 and second TSVs 295a-295b are essentially coplanar with the second surface 222 of the second semiconductor substrate 220.

It should be noted that, following process 1014 discussed below, the spiral-shaped metallic feature 225 will be aligned over the first spiral-shaped metallic feature 215 but not be in direct contact therewith (instead these features will be electrically connected in parallel through stacked TSVs). Thus, the spiral-shaped openings could be formed at process 1004A and 1004B so that the spiral-shaped metallic features will either have essentially identical horizontal cross-sections (as discussed above regarding the semiconductor structure 200A of FIGS. 2A-2C) or different horizontal cross-sections (as discussed above regarding the semiconductor structure 200B of FIGS. 3A-3B). For purposes of illustration, processes 1004A and 1004B and the remaining processes steps are shown in the figures with respect to the formation of the semiconductor structure 200A. However, it should be understood that other than a change in the patterning process for the openings, these same processes could be performed to form the semiconductor structure 200B.

Figure 13:
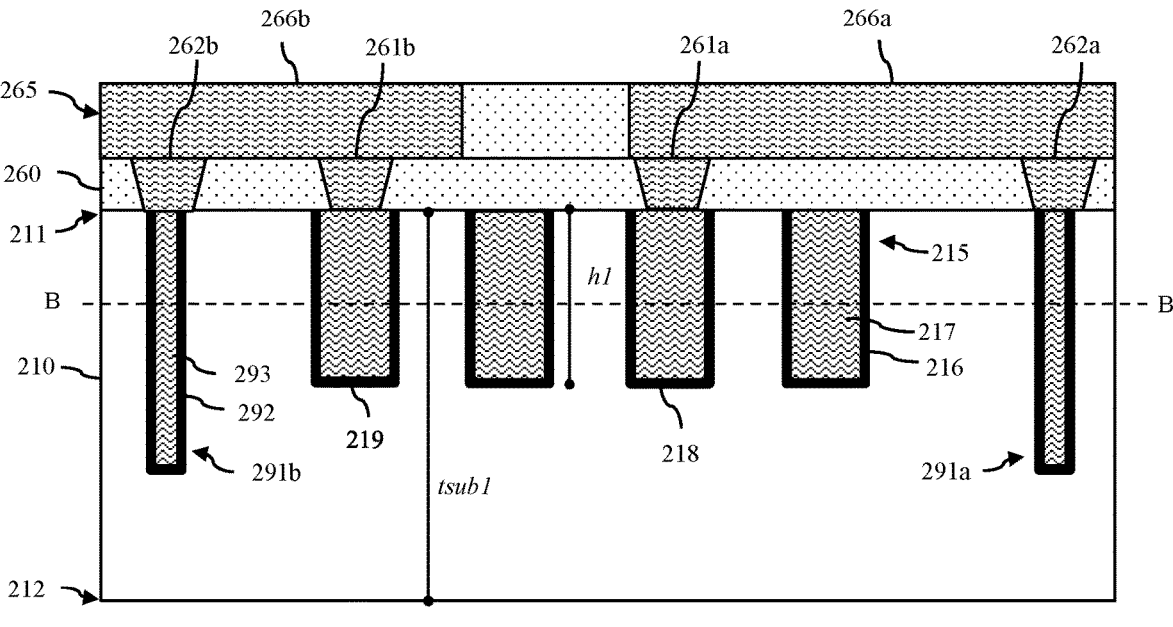
Figure 14:
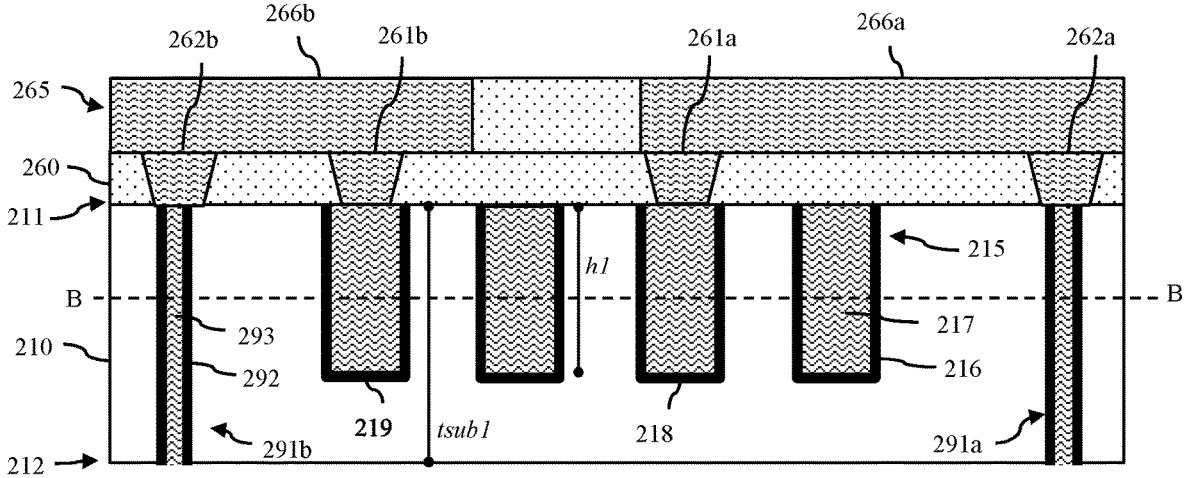

A first dielectric layer 260 can be formed on the first surface 211 of the first semiconductor substrate 210 over the exposed surfaces of the first spiral-shaped metallic feature 215 and first TSVs 291a-291b (see process 1006A and FIG. 13). Contacts can be formed that extend through the first dielectric layer 260 (see process 1008A and FIG. 13). These contacts can include first input and output terminal contacts 261a-261b to the first inner and outer ends 218-219, respectively, of the first spiral-shaped metallic feature 215 and first TSV contacts 262a-262b to the first TSVs 291a-291b, respectively. BEOL processing can be performed to form first BEOL metal levels 265 with various interconnects (e.g., wires and/or vias) within BEOL dielectric layers (see process 1010A and FIG. 13). Such interconnects can be formed at process 1010A to electrically connect the first input terminal contact 261a to the first TSV contact 262a and to further electrically connect the first output terminal contact 261b to the other first TSV contact 262b. Techniques for forming contacts and for BEOL processing are well known in the art and, thus, the details thereof have been omitted from this specification in order to allow the reader to focus on the salient aspects of the disclosed methods. A CMP process can also be performed to expose surfaces of the first TSVs 291a-291b at the first surface 212 of the first semiconductor substrate 210 opposite the first dielectric layer 260 (see process 1012A and FIG. 14).

Figure 15:
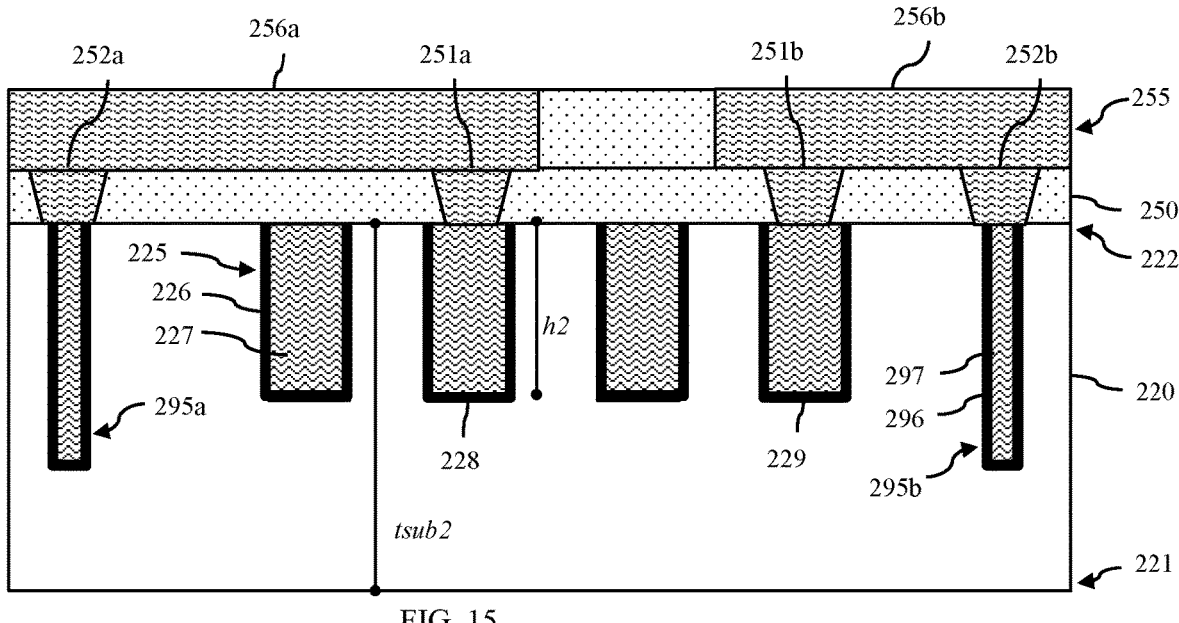

A second dielectric layer 250 can be formed on the second surface 222 of the second semiconductor substrate 220 over exposed surfaces of the second spiral-shaped metallic feature 225 and second TSVs 295a-295b (see process 1006B and FIG. 15). Contacts can be formed that extend through the second dielectric layer 250 (see process 1008B and FIG. 15). These contacts can include second input and output terminal contacts 251a-251b to the second inner and outer ends 228-229, respectively, of the second spiral-shaped metallic feature 225 and second TSV contacts 252a-252b to the second TSVs 295a-295b, respectively. BEOL processing can be performed to form second BEOL metal levels 255 with various interconnects (e.g., wires and/or vias) within BEOL dielectric layers (see process 1010B and FIG. 15). Such interconnects can be formed at process 1010B to electrically connect the second input terminal contact 251a to the second TSV contact 252a and to electrically connect the second output terminal contact 251b to the other second TSV contact 252b. As mentioned above, techniques for forming contacts and for BEOL processing are well known in the art and, thus, the details thereof have been omitted from this specification to allow the reader to focus on the salient aspects of the disclosed methods. Another CMP process can also be performed to expose surfaces of the second TSVs 295a-295b at the second surface 221 of the second semiconductor substrate 220 opposite the second dielectric layer 250 (see process 1012B and FIG. 16).

Figure 16:
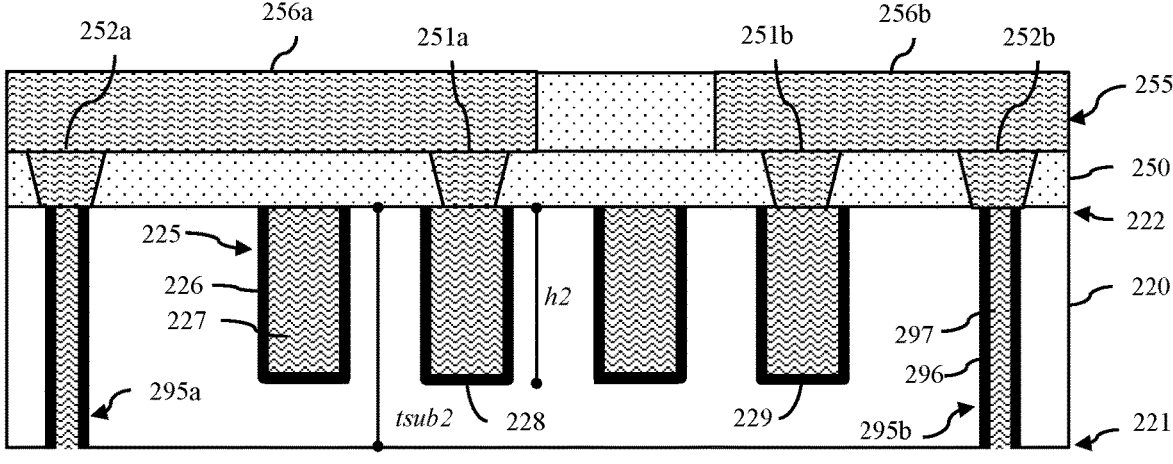
Figure 17:
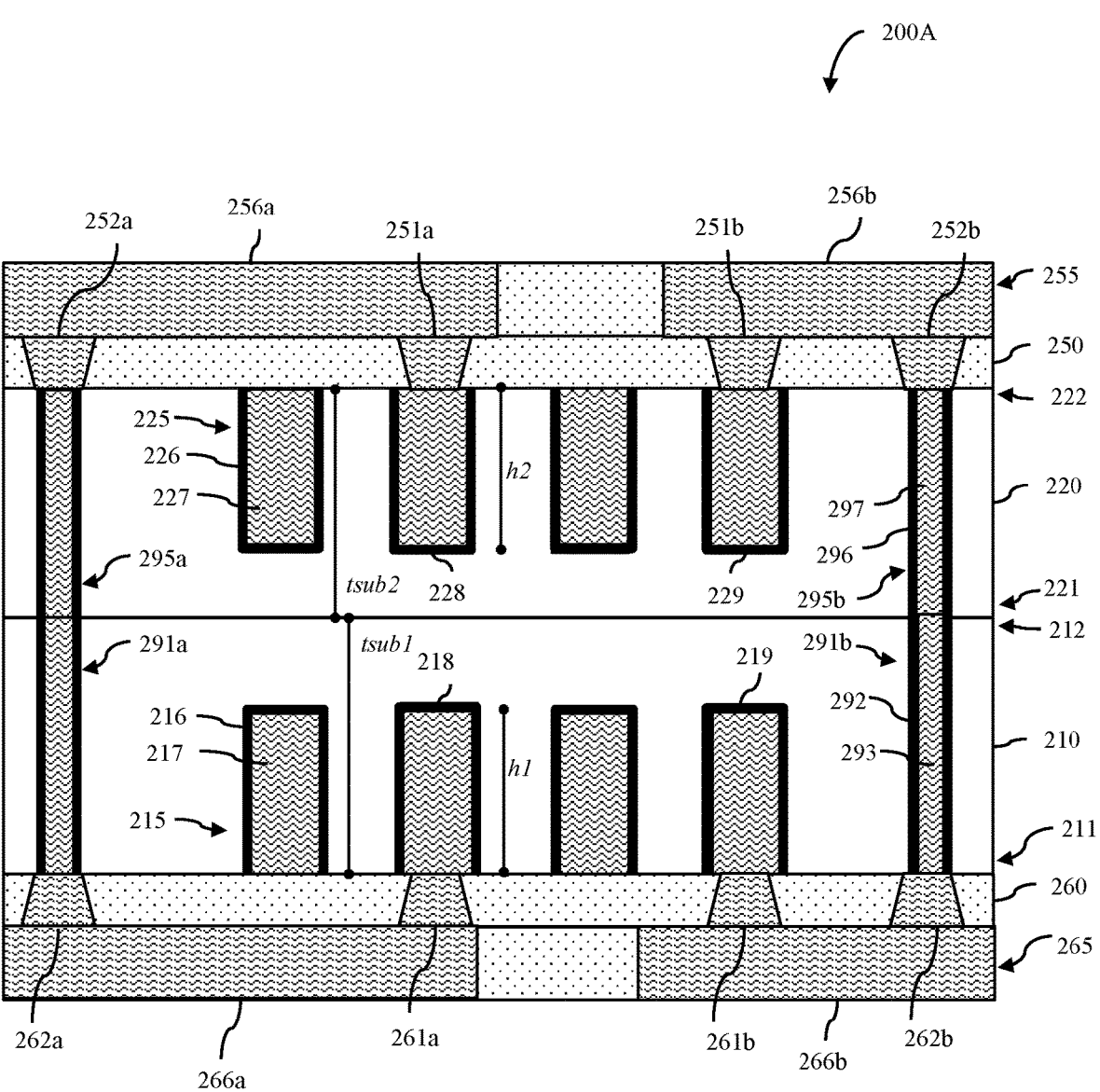

The method can further include flipping one of the semiconductor substrates (e.g., the first semiconductor substrate 210), stacking them together so that the first surface 212 of the first semiconductor substrate 210 is immediately adjacent to the second surface 221 of the second surfaces and so that the second TSVs 295a-295b are aligned and in contact with the first TSVs 291a-291b, respectively, and direct bonding (also referred to herein as fusion bonding) the adjacent surfaces together (see process 1014 and FIG. 16). Wafer bonding at process 1014 can include wafer preprocessing, pre-bonding at room temperature, and annealing at elevated temperatures. Alternatively, low temperature direct bonding could be performed. Such direct wafer bonding techniques are well known in the art and, thus, the details thereof have been omitted form this specification to allow the reader to focus on the salient aspects of the disclosed embodiments.

In this method, following process 1014, the first spiral-shaped metallic feature 215 (i.e., a first inductor) and the second spiral-shaped metallic feature 225 (i.e., a second inductor) will be electrically connected in parallel and this parallel inductor circuit effectively functions as a single relatively large inductor with a relatively high $Q_{dc}$ within a relatively small chip area. Since, as mentioned above $Q_{dc}=\omega L_{dc}/R_{dc}$, the dimensions of the two spiral-shaped metallic features 215, 225 (including the respective heights, numbers of turns, spiral shapes, wire widths, and wires spacings) and the metallic fill material(s) used can be selected during design to fine tune (i.e., adjust) the $Q_{dc}$ to a desired relatively high level.

In the structures and methods described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments disclosed above have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first semiconductor substrate;
a second semiconductor substrate in contact with the first semiconductor substrate;
a first spiral-shape metallic feature in the first semiconductor substrate; and
a second spiral-shaped metallic feature in the second semiconductor substrate and electrically connected to the first spiral-shaped metallic feature,
wherein turns of the second spiral-shaped metallic feature are immediately adjacent to turns of the first spiral-shaped metallic feature.

2. The structure of claim 1,
wherein the first semiconductor substrate and the second semiconductor substrate have bonded surfaces,
wherein the first spiral-shaped metallic feature and the second spiral-shaped metallic feature have essentially identical horizontal cross-sections, and
wherein the second spiral-shaped metallic feature is stacked above and immediately adjacent to the first spiral-shaped metallic feature at the bonded surfaces of the first semiconductor substrate and the second semiconductor substrate to form an inductor.

3. The structure of claim 2,
wherein the first semiconductor substrate has first opposing surfaces,
wherein the second semiconductor substrate has second opposing surfaces, wherein a first opposing surface is bonded to a second opposing surface,
wherein the first spiral-shaped metallic feature extends into the first semiconductor substrate from the first opposing surface that is bonded to the second opposing surface, and
wherein the second spiral-shaped metallic feature extends between the second opposing surfaces through the second semiconductor substrate.

4. The structure of claim 3, further comprising:
a dielectric layer on the second semiconductor substrate opposite the first semiconductor substrate; and
contacts extending through the dielectric layer to inner and outer ends, respectively, of the second spiral-shaped metallic feature.

5. The structure of claim 3, wherein the first spiral-shaped metallic feature extends partially through the first semiconductor substrate.

6. The structure of claim 3,
wherein the first spiral-shaped metallic feature comprises: a first spiral-shaped opening in the first semiconductor substrate; a first dielectric liner lining first horizontal and vertical surfaces of the first spiral-shaped opening; and a first metallic fill material on the first dielectric liner filling the first spiral-shaped opening, and
wherein the second spiral-shaped metallic feature comprises: a second spiral-shaped opening in the second semiconductor substrate; a second dielectric liner lining second vertical surfaces of the second spiral-shaped opening; and a second metallic fill material filling the second spiral-shaped opening and immediately adjacent to the first metallic fill material.

7. The structure of claim 6, wherein the first metallic fill material and the second metallic fill material comprise copper.

8. A method comprising:
forming a first spiral-shape metallic feature in a first semiconductor substrate;
forming a second spiral-shaped metallic feature in a second semiconductor substrate; and
forming a structure comprising the first semiconductor substrate and the second semiconductor substrate, wherein the second semiconductor substrate is in contact with the first semiconductor substrate, wherein the second spiral-shaped metallic feature is electrically connected to the first spiral-shaped metallic feature, and wherein turns of the second spiral-shaped metallic feature are immediately adjacent to turns of the first spiral-shaped metallic feature.

9. The method of claim 8, wherein the first semiconductor substrate has first opposing surfaces and the second semiconductor substrate has second opposing surfaces and wherein the method further comprises:
forming the first spiral-shaped metallic feature in the first semiconductor substrate adjacent to one of the first opposing surfaces; and
forming the second spiral-shaped metallic feature in the second semiconductor substrate adjacent to one of the second opposing surfaces.

10. The method of claim 9,
wherein the first spiral-shaped metallic feature and the second spiral-shaped metallic feature are formed to have essentially identical horizontal cross-sections, and
wherein the forming of the structure comprises bonding the one of the first opposing surfaces of the first semiconductor substrate to the one of the second opposing surface of the second semiconductor substrate such that the second spiral-shaped metallic fea-
ture is aligned above and immediately adjacent to the
first spiral-shaped metallic feature at bonded surfaces
of the first semiconductor substrate and the second
semiconductor substrate.

11. The method of claim 10, wherein the forming of the
structure further comprises:

polishing a second opposing surface opposite the bonded
surfaces to expose the second spiral-shaped metallic
feature;

forming a dielectric layer on the second semiconductor
substrate opposite the bonded surfaces; and forming contacts through the dielectric layer to inner and
outer ends of the second spiral-shaped metallic feature.

12. The method of claim 9, wherein the first spiral-shaped metallic feature is a first
inductor, and the second spiral-shaped metallic feature
is a second inductor, and wherein the forming of the structure comprises:

forming two first through substrate vias in the first
semiconductor substrate adjacent to the one of the
first opposing surfaces and electrically connected to
first inner and outer ends of the first inductor;

forming two second through substrate vias in the sec-
ond semiconductor substrate adjacent to the one of
the two second opposing surfaces and electrically
connected to second inner and outer ends, respec-
tively, of the second inductor; and bonding the first semiconductor substrate to the second
semiconductor substrate such that the two second
through substrate vias are aligned above and imme-
diately adjacent to the two first through substrate vias
and the first inductor and the second inductor are
electrically connected in parallel.

13. The method of claim 12, wherein the first spiral-
shaped metallic feature is positioned laterally between the
two first through substrate vias and the second spiral-shaped
metallic feature is positioned laterally between the two
second through substrate vias, and wherein the first spiral-
shaped metallic feature and the second spiral-shaped metal-
lic feature have any of essentially identical horizontal cross-
sections or different horizontal cross-sections.

14. The structure of claim 2, wherein bottom surfaces of
the turns of the second spiral-shaped metallic feature and top
surfaces of the turns of the first spiral-shaped metallic
feature are co-planar with the bonded surfaces.

15. The structure of claim 1, wherein a number of the
turns of the second spiral-shaped metallic feature is equal to
a number of the turns of the first spiral-shaped metallic
feature.

16. The structure of claim 1, wherein a heights of the
second spiral-shaped metallic feature and the first spiral-
shaped metallic feature are different.

17. A structure comprising:

a first semiconductor substrate;

a second semiconductor substrate in contact with the first
semiconductor substrate;

a first spiral-shape metallic feature in the first semicon-
ductor substrate; and a second spiral-shaped metallic feature in the second
semiconductor substrate and electrically connected to
the first spiral-shaped metallic feature, wherein the first semiconductor substrate and the second
semiconductor substrate have bonded surfaces, wherein the first spiral-shaped metallic feature and the
second spiral-shaped metallic feature have essentially
identical horizontal cross-sections, wherein the second spiral-shaped metallic feature is
stacked above and immediately adjacent to the first
spiral-shaped metallic feature at the bonded surfaces of
the first semiconductor substrate and the second semi-
conductor substrate to form an inductor, wherein the first semiconductor substrate has first oppos-
ing surfaces, wherein the second semiconductor substrate has second
opposing surfaces, wherein a first opposing surface is bonded to a second
opposing surface, wherein the first spiral-shaped metallic feature extends
into the first semiconductor substrate from the first
opposing surface that is bonded to the second opposing
surface, and wherein the second spiral-shaped metallic feature extends
between the second opposing surfaces through the
second semiconductor substrate, wherein the first spiral-shaped metallic feature comprises:
a first spiral-shaped opening in the first semiconductor
substrate; a first dielectric liner lining first horizontal
and vertical surfaces of the first spiral-shaped opening;
and a first metallic fill material on the first dielectric
liner filling the first spiral-shaped opening, and wherein the second spiral-shaped metallic feature com-
prises: a second spiral-shaped opening in the second
semiconductor substrate; a second dielectric liner lin-
ing second vertical surfaces of the second spiral-shaped
opening; and a second metallic fill material filling the
second spiral-shaped opening and immediately adja-
cent to the first metallic fill material.

18. The structure of claim 17, further comprising:

a dielectric layer on the second semiconductor substrate
opposite the first semiconductor substrate; and contacts extending through the dielectric layer to inner
and outer ends, respectively, of the second spiral-
shaped metallic feature.

19. The structure of claim 17, wherein the first spiral-
shaped metallic feature extends partially through the first
semiconductor substrate.

20. The structure of claim 17, wherein the first metallic fill
material and the second metallic fill material comprise
copper.

\* \* \* \* \*